United States Patent
Kitagata et al.

(10) Patent No.: US 12,367,928 B2
(45) Date of Patent: Jul. 22, 2025

(54) SEMICONDUCTOR DEVICE

(71) Applicant: RENESAS ELECTRONICS CORPORATION, Tokyo (JP)

(72) Inventors: Daiki Kitagata, Tokyo (JP); Shinji Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 127 days.

(21) Appl. No.: 18/169,463

(22) Filed: Feb. 15, 2023

(65) Prior Publication Data
US 2023/0317151 A1    Oct. 5, 2023

(30) Foreign Application Priority Data
Feb. 25, 2022   (JP) ................... 2022-027660

(51) Int. Cl.
*G11C 11/419*   (2006.01)

(52) U.S. Cl.
CPC ................... *G11C 11/419* (2013.01)

(58) Field of Classification Search
CPC .................................... G11C 11/419
USPC ......................................... 365/154
See application file for complete search history.

(56) References Cited

U.S. PATENT DOCUMENTS

| | | | | |
|---|---|---|---|---|
| 6,888,730 B2* | 5/2005 | Foss | ...... | G11C 15/04 365/49.1 |
| 7,120,040 B2* | 10/2006 | Perry | ...... | G11C 15/04 365/49.11 |
| 8,130,525 B2* | 3/2012 | Arsovski | ...... | G11C 15/04 711/108 |
| 11,475,953 B1* | 10/2022 | Tseng | ...... | G11C 15/04 |
| 2002/0141218 A1* | 10/2002 | Foss | ...... | G11C 15/04 365/49.17 |
| 2003/0185044 A1* | 10/2003 | Nii | ...... | H10B 10/12 365/154 |
| 2007/0008760 A1* | 1/2007 | Nii | ...... | G11C 15/04 365/233.1 |
| 2009/0141529 A1* | 6/2009 | Arsovski | ...... | G11C 15/04 365/49.17 |
| 2010/0271854 A1* | 10/2010 | Chu | ...... | G11C 15/04 365/49.1 |
| 2018/0068708 A1* | 3/2018 | Nii | ...... | G11C 15/04 |
| 2020/0257501 A1* | 8/2020 | Yabuuchi | ...... | G06N 3/065 |
| 2023/0386544 A1* | 11/2023 | Godo | ...... | H10B 53/30 |

FOREIGN PATENT DOCUMENTS

JP   2020-129582 A   8/2020

* cited by examiner

*Primary Examiner* — Sung Il Cho
(74) *Attorney, Agent, or Firm* — Rimon P.C.

(57) ABSTRACT

A semiconductor device includes a first data line, a second data line, and a memory cell connected to the first data line and the second data line. The memory cell includes a plurality of switches, a first data holding circuit, a second data holding circuit, a third data holding circuit, a fourth data holding circuit, and an input line. A characteristic value of the memory cell is changeable by controlling the switch connected to the first data line among the plurality of switches based on a value held by the third data holding circuit and by controlling the switch connected to the second data line among the plurality of switches based on a value held by the fourth data holding circuit.

6 Claims, 19 Drawing Sheets

FIG. 10

| Step | #PBL=32, #NBL=21 | CD[6:0] | MQ[0] |
|---|---|---|---|
| 1st | PBL 32 / NBL 21 | | 0 |
| 2nd | PBL 32 / NBL 21 64 — α | 0b1000000 | 0 |
| 3rd | PBL 32 / NBL 21 32 | 0b0100000 | 0 |
| 4th | PBL 32 / NBL 21 16 | 0b0010000 | 0 |
| 5th | PBL 32 / NBL 21 8 | 0b0001000 | 1 |
| 6th | PBL 32 / NBL 21 8 4 | 0b0001100 | 0 |
| 7th | PBL 32 / NBL 21 8 —2 | 0b0001010 | 1 |
| 8th | PBL 32 / NBL 21 8 —1, 2 | 0b0001011 | 1 |

Output=0b0000_1011=11

SEMICONDUCTOR DEVICE

CROSS-REFERENCE TO RELATED APPLICATIONS

The present application claims priority from Japanese Patent Application No. 2022-027660 filed on Feb. 25, 2022, the content of which is hereby incorporated by reference to this application.

BACKGROUND

The present disclosure relates to a semiconductor device and is applicable to, for example, a semiconductor device in which a large number of product-sum operations requires being performed.

With development of machine learning by deep learning, artificial intelligence (AI) is being applied in various places. Since this method requires a large amount of product-sum accelerator is used to accelerate a processing of the product-sum operations.

The AI accelerator may use a Processing in Memory (PIM). For example, Japanese Patent Application Laid-Open No. 2020-129582 (Patent Document 1) discloses a semiconductor device including a memory cell that: is connected to a data line; stores three-valued data; and performs product-sum operations among the stored data, inputted data, and data on the data line.

SUMMARY

In a configuration of Patent Document 1, when the number of memory cells connected to the data line increases, stable sum operations may not be performed due to variations in characteristic values such as a current and a capacity of the memory cell.

Other problems and novel features of the present disclosures will be apparent from descriptions of the specification and the accompanying drawings.

A brief outline of a representative one of the present disclosures is as follows. That is, a semiconductor device includes a first data line, a second data line, and a memory cell connected to the first data line and the second data line. The memory cell includes a plurality of switches, a first data holding circuit, a second data holding circuit, a third data holding circuit, a fourth data holding circuit, and an input line. A characteristic value of the memory cell is changeable by controlling the switch connected to the first data line among the plurality of switches based on a value held by the third data holding circuit and by controlling the switch connected to the second data line among the plurality of switches based on a value held by the fourth data holding circuit.

According to the above-mentioned semiconductor device, variations in characteristic values of the memory cell can be reduced.

BRIEF DESCRIPTION OF THE DRAWINGS

FIG. 10 is a diagram for explaining A/D conversion.

DETAILED DESCRIPTION

Figure 1:
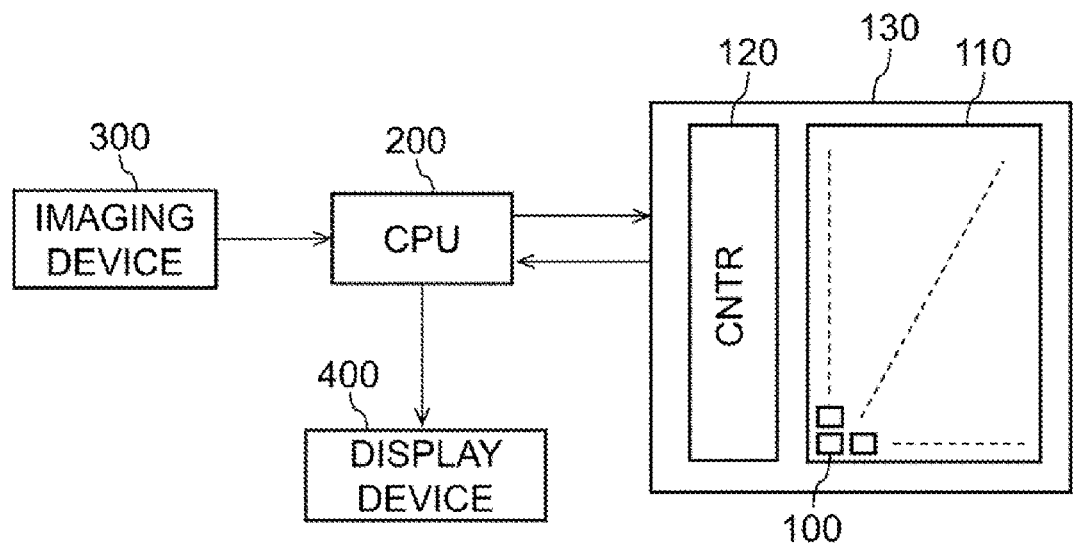
FIG. 1 is a block diagram showing a configuration example of an inference device according to an embodiment.

Hereinafter, embodiments and modification examples will be described with reference to the drawings. However, in the following description, the same reference numerals are denoted to the same components, and a repetitive description thereof may be omitted.

<Configuration of Inference Device>

FIG. 1 is a block diagram showing a configuration example of an inference device according to an embodiment.

An inference device in an embodiment includes an AI accelerator 130, a central processing unit (CPU) 200, an imaging device (IMAGING DEVICE) 300, and a display device (DISPLAY DEVICE) 400. The imaging device 300 is a camera, a scanner, or the like, and acquires image data and provides it to the central processing unit 200. The central processing unit 200 processes the provided image data and provides it to the AI accelerator 130. The AI accelerator 130 makes an inference based on the provided image data and provides its inference result to the central processing unit 200. The central processing unit 200 processes the provided inference result and provides it to the display device 400. The display device 400 displays the provided inference result.

The AI accelerator 130 includes: an integrated block 110 configured by collecting a large number of product-sum operation devices 100; and its control circuit (CNTR) 120. The product-sum operation device 100 is configured by a PIM architecture. The AI accelerator 130 is, for example, a semiconductor device formed on one semiconductor substrate, such as a microcontroller incorporating the product-sum 20 operation device 100.

<Configuration of Product-Sum Operation Device>

Figure 2:
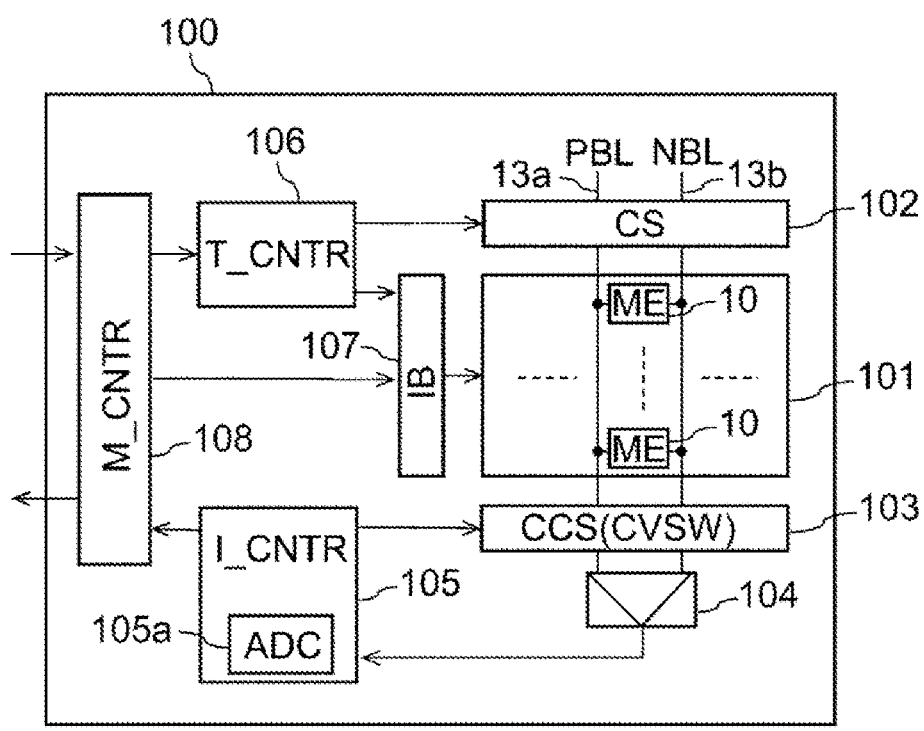
FIG. 2 is a block diagram showing a configuration example of a product-sum operation device shown in FIG. 1.

FIG. 2 is a block diagram showing a configuration example of a product-sum operation device shown in FIG. 1. The product-sum operation device 100 in the embodiment has an adjustment of reducing variations in function characteristic values of a memory cell with a product-sum operation function of performing product-sum operations (hereinafter referred to as a "product-operation memory cell") in addition to product-sum operation processings.

The product-sum operation device 100 includes a memory cell array 101, a current source (CS) 102, a common power supply line switch (CVSW) 103 as a constant current source (CCS), and a sense amplifier 104. The product-sum operation device 100 further includes an inference control circuit (I_CNTR) 105, an adjustment control circuit (T_CNTR) 106, an input buffer (IB) 107, and a memory controller (M_CNTR) 108.

The memory cell array 101 is composed of a plurality of product-operation memory cells (ME) 10. The product-operation memory cell 10 is connected to a data line (PBL) 13a and a data line (NBL) 13b. The sense amplifier 104 as a comparison circuit determines the sum of the number of product-operation memory cells 10 connected to the data lines 13a, 13b based on input data supplied from the input buffer 107, thereby performing the product-sum operation.

The product-operation memory cell 10 executes a product operation between three-valued logic value stored in the product-operation memory cell 10 and a logic value of the input data, and operates to draw currents from the data lines 13a, 13b according to a result of the product operation. The product-operation memory cell 10 of the embodiment is an example using current sensing.

The currents according to the product operation results of the plurality of product-operation memory cells 10 are superimposed on each of the data lines 13a, 13b, and a current and a voltage are determined on each of the data lines 13a, 13b. That is, a sum operation is performed so that products obtained in the plurality of product-operation memory cells 10 find sums by the data line 13a and the data line 13b. A result of the product-sum operation, which is a result of the sum operation, is outputted via the data lines 13a, 13b.

The inference control circuit 105 performs AD conversion by controlling inference reference cells and the like which will be described later. The adjustment control circuit 106 is used to optimize current paths of the product-operation memory cells 10, which will be described later, and to reduce variations. Details thereof will be described later.

<Configuration of Memory Cell Column of Memory Allay>

Figure 3:
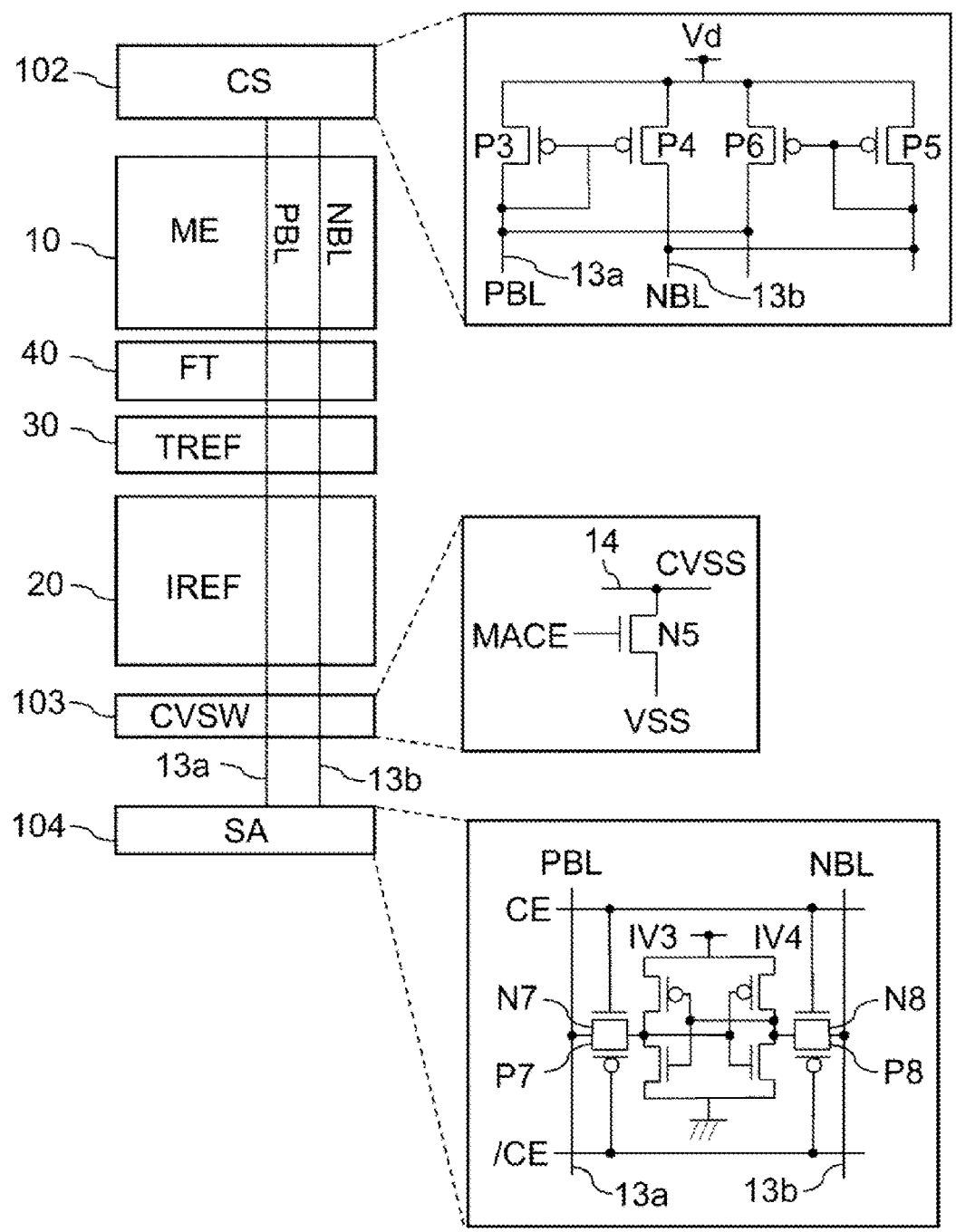
FIG. 3 is a diagram showing one memory cell column and parts related thereto in a memory array shown in FIG. 2.

FIG. 3 is a diagram showing one memory cell column and parts related thereto in the memory array shown in FIG. 2.

A memory cell column in the memory cell array 101 includes a plurality of product-operation memory cells 10, a plurality of inference reference cells (IREF) 20, an adjustment reference cell (TREF) 30, and a fine adjustment cell (FT) 40. The respective cells are connected to the data lines 13a, 13b. A current source (CS) 102, a common power supply switch (CVSW) 103, and a sense amplifier (SA) 104 are also connected to the data lines 13a, 13b. The respective cells will be described below.

<Configuration of Product-Operation Memory Cell (ME)>

Figure 4:
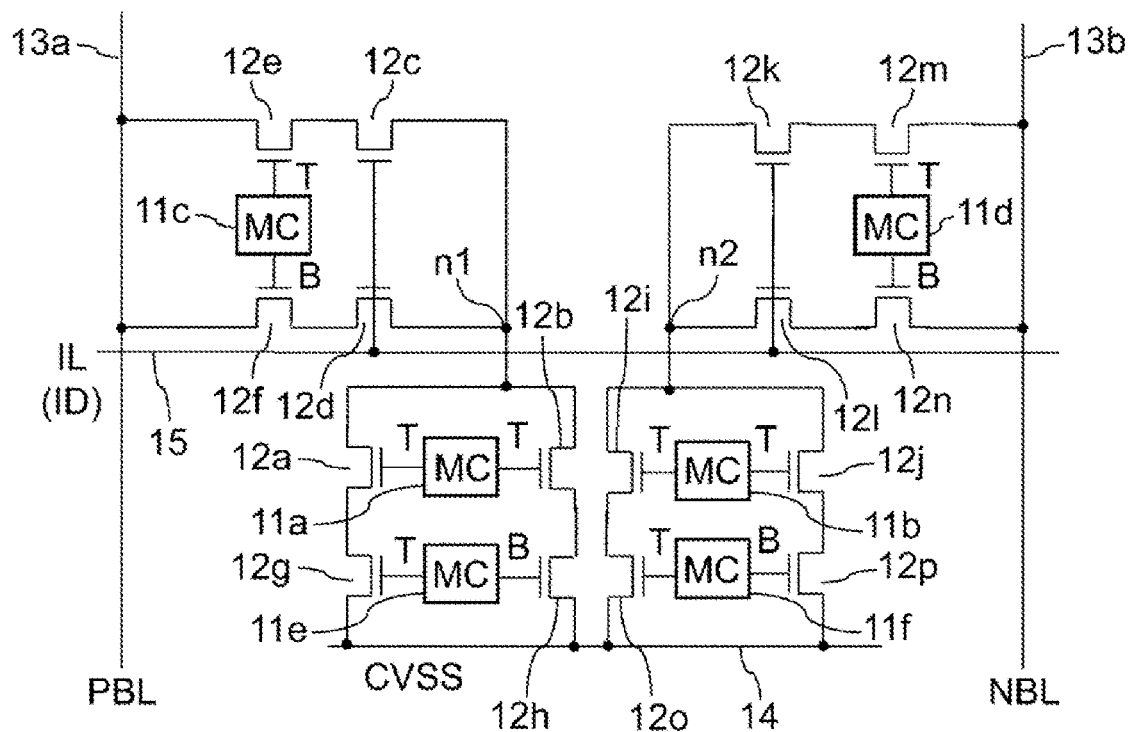
FIG. 4 is a diagram showing a configuration example of a product-operation memory cell shown in FIG. 3.

FIG. 4 is a diagram showing a configuration example of a product-operation memory cell shown in FIG. 3.

The product-operation memory cell 10 includes two weight memory cells (MC) 11a, 11b, and eight switches 12a to 12d, 12i to 12l in order to perform the product-sum operation. The product-operation memory cell 10 further includes four path switching memory cells (MC) 11c to 11f, and eight switches 12e to 12h, 12m to 12p in order to switch current paths.

The switches 12e, 12f are connected to the data line 13a and the memory cell 11c. When the memory cell 11c stores, for example, a logic value of "1", the switch 12e becomes an ON-state and the switch 12f becomes an OFF-state. The switches 12c, 12d are connected between a node n1 and the switches 12e, 12f, respectively. The switches 12c, 12d are connected to an input line (IL) 15, and become ON-states when the input data (ID) applied to the input line 15 is at a high level indicating, for example, a logic value of "1".

The switches 12a, 12b are connected to the node n1 and the memory cell 11a, and when the memory cell 11a stores, for example, a logic value of "1", the switches 12a, 12b become ON-states. The switches 12g, 12h are connected between the switches 12a, 12b and the common power supply line 14, respectively, and are connected to the memory cell 11e. When the memory cell 11e stores, for example, a logic value of "1", the switch 12g becomes an ON-state and the switch 12h becomes an OFF-state.

The switches 12m, 12n are connected to the data line 13b and the memory cell 11d. When the memory cell 11d stores, for example, a logic value of "1", the switch 12m becomes an ON-state and the switch 12n becomes an OFF-state. The switches 12k, 12l are connected between a node n2 and the switches 12m, 12n, respectively. The switches 12k, 12l are connected to the input line 15 and become ON-states when the input data applied to the input line 15 is, for example, a logic value "1".

The switches 12l, 12j are connected to the node n2 and the memory cell 11b, and the switches 12l, 12j becomes ON-states when the memory cell 11b stores, for example, a logic value of "1". The switches 12o, 12p are connected between the switches 12l, 12j and the common power supply line (CVSS) 14, respectively, and are connected to the memory cell 11f. When the memory cell 11f stores, for example, a logic value of "1", the switch 12o becomes an ON-state and the switch 12p becomes an OFF-state.

(Product-Sum Operation)

The memory cell 11a provides an in-phase value (T) to the switches 12a, 12b, and the memory cell 11b provides an in-phase value (T) to the switches 12l, 12j. Consequently, when the input data (ID) supplied to the input line 15 becomes a high level indicating a logic value of "1", the product operation of the product-operation memory cell 10 is controlled by the data held in the memory cells 11a, 11b.

The product-sum operation is performed by three values of the following (a) to (c). Therefore, setting both values of the memory cells 11a, 11b to the logic value "1" is prohibited:

(a) Connection of a data line 13a side to the common power supply line 14 (logic value "+1");

(b) Connection of a data line 13b side to the common power supply line 14 (logic value "−1"); and (c) Shut-off of the connection between the data line 13a side and the common power supply line 14 and the connection between the data line 13b side and the common power supply line 14 (logic value "0").

The sum operation is performed by the current via the switch of the product-operation memory cell 10 on the data lines 13a, 13b.

It is assumed that when both the memory cells 11a, 11b store the logic value "0", the product-operation memory cell 10 stores the logic value "0". It is also assumed that when the memory cell 11a stores a logic value of "1" and the memory cell 11b stores a logic value of "0", the product-operation memory cell 10 stores a logic value of "+1". It is further assumed that when the memory cell 11a stores a logic value "0" and the memory cell 11b stores a logic value "1", the product-operation memory cell 10 stores a logic value "−1". Here, assuming that the memory cells 11c, 11d, 11e, and 11f store a logic value "1", the following will be described.

Consequently, when the logic value "0" is stored in the product-operation memory cell 10, the switches 12a, 12b, 12i, and 12j become OFF-states. Therefore, even if the input data (ID) is, for example, a logic value of "1", no current flows from the data lines 13a, 13b to the common power supply line 14.

In contrast, when the logic value "+1" is stored in the product-operation memory cell 10, the switches 12a, 12b become ON-states and the switches 12l, 12j become OFF-states. At this time, if the input data (ID) has a logic value of "1", a current flows from the data line 13a to the common power supply line 14 via the ON-state switches 12e, 12c, 12a, and 12g and a voltage of the data line 13a drops. At this time, a voltage of the data line 13b does not drop. Meanwhile, if the input data (ID) has a logic value of "0" at this time, the ON-state switches 12c, 12d, 12k, and 12l become the OFF-states. Therefore, no current flows from the data lines 13a, 13b to the common power supply line 14, and the voltages of the data lines 13a, 13b do not drop.

Furthermore, when the logic value "−1" is stored in the product-operation memory cell 10, the switches 12l, 12j become ON-states and the switches 12a, 12b become OFF-states. At this time, if the input data (ID) has a logic value of "1", a current flows from the data line 13b to the common power supply line 14 via the ON-state switches 12m, 12k, 12i, and 12o, and the voltage of the data line 3b drops and the voltage of the data line 13a does not drop. Meanwhile, if the input data has a logic value of "0" at this time, the ON-state switches 12c, 12d, 12k, and 12l become OFF-states. Therefore, no current flows from the data lines 13a, 13b to the common power supply line 14, and the voltages of the data lines 13a, 13b do not drop.

That is, it can be considered that the memory cell 11a is used to store the logic value "+1" in the product-operation memory cell 10, and the memory cell 11b is used to store the logic value "−1" in the product-operation memory cell 10.

Consequently, the product operation is performed between the three values stored in the product-operation memory cell 10 and the value of the input data (ID). That is, six states of 0× 0, 0×(+1), 0×(−1), 1×0, 1×(+1), and 1×(−1) are formed according to the logic value of the input data (ID) and the logic value of the product-operation memory cell 10. In this case, the product operation is performed between the logic value of the input data (ID) and the logic value stored in the product-operation memory cell 10. When a result of the product operation is a logic value "1", a current flows between the data line 13a and the common power supply line 14 and the voltage of the data line 13a drops. In contrast, when the result of the product operation is the logic value "−1", a current flows between the data line 13b and the common power supply line 14 and the voltage of the data line 13b drops.

(Current Path Switching)

Some of the switches 12a to 12h are connected in series (cascaded) to form a current path that connects the data line 13a to the common power supply line 14. A plurality of current paths can be formed. One of the plurality of current paths is selected by the ON/OFF-states of the switches 12a to 12h, and the current paths are switched. Some of the switches 12i to 12p are connected in series (cascaded) to form a current path that connects the data line 13b to the common power supply line 14. A plurality of current paths can be formed. One of the plurality of current paths is selected by the ON/OFF-states of the switches 12i to 12p, and the current paths are switched.

Since the memory cell 11c provides complementary values (T/B) to the switches 12e, 12f, one of the switches 12e, 12f is set to an ON-state and the other is set to an OFF-state. Since memory cell 11d provides complementary values (T/B) to the switches 12m, 12n, one of the switches 12m, 12n is set to an ON-state and the other is set to an OFF-state. Since the memory cell 11e provides complementary values (T/B) to the switches 12g, 12h, one of the switches 12g, 12h is set to an ON-state and the other is set to an OFF-state. Since the memory cell 11f provides complementary values (T/B) to the switches 12o, 12p, one of the switches 12o, 12p is set to an ON-state and the other is set to an OFF-state. Consequently, one of four kinds of current paths is selected for each of the data lines 13a, 13b.

<Detailed Configuration of Product-Operation Memory Cell (ME)>

Figure 5:
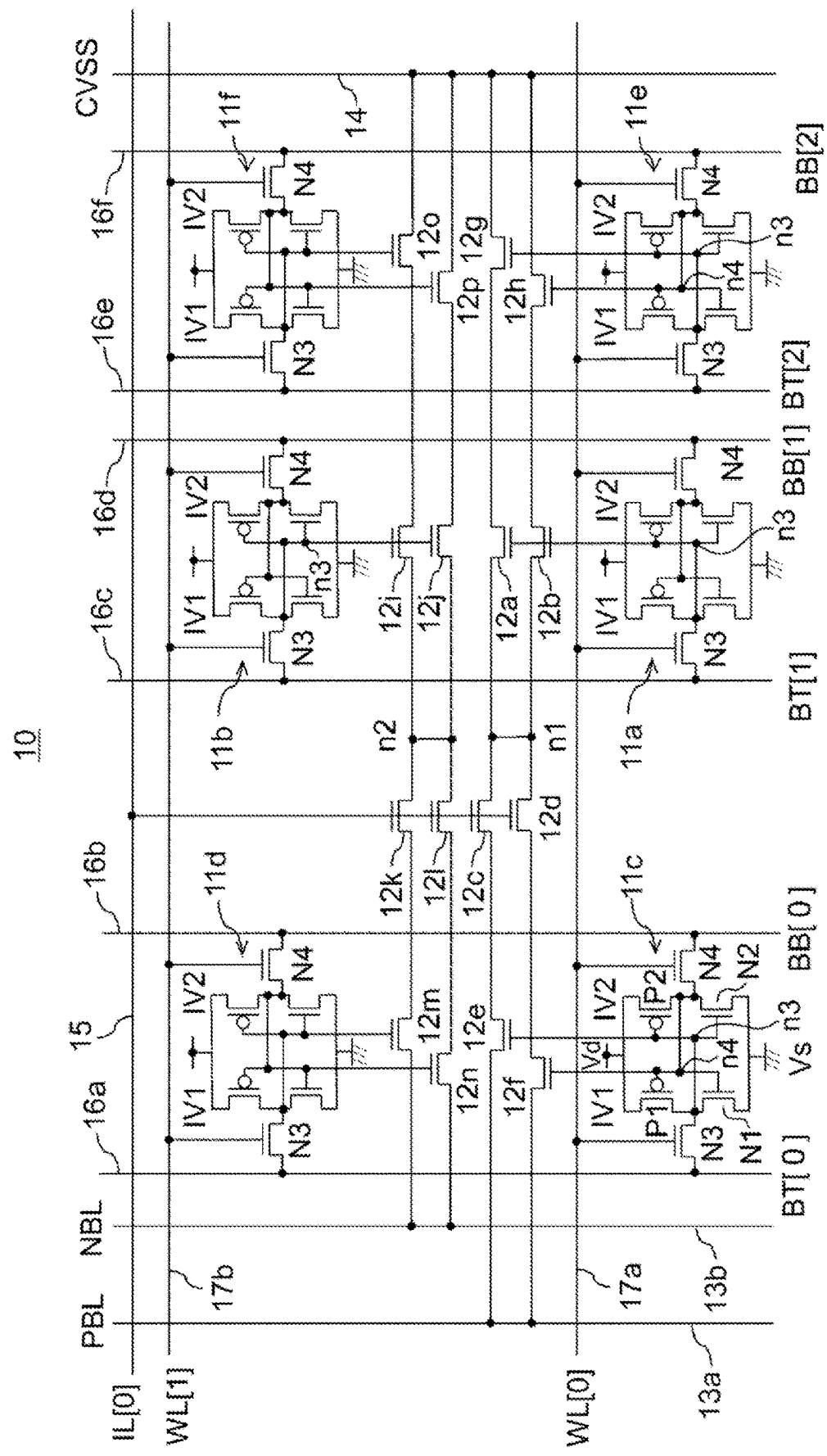
FIG. 5 is a circuit diagram showing details of a configuration example of the product-operation memory cell shown in FIG. 4.

FIG. 5 is a circuit diagram showing a configuration of a product-operation memory cell shown in FIG. 4.

The memory cells 11a to 11f as data holding circuits in the product-operation memory cell 10 are composed of SRAM (static random access memory) memory cells. The SRAM memory cell is composed of, for example, six transistors. Each piece of data held in the memory cells 11a to 11f is controlled by three data line pairs (BT [2:0], BB [2:0]) 16a to 16f and two word lines (WL [1:0]) 17a, 17b for normal SRAM operations. This makes it possible to write and read values by specifying one of the six SRAM memory cells externally. The switches 12a to 12p in the product-operation memory cell 10 are composed of NMOS transistors.

A configuration of the memory cells 11a to 11f will be explained by using the memory cell 11c as an example. The memory cell 11c is configured by a plurality of P-channel field effect transistors (referred to as PMOS transistors) and a plurality of N-channel field effect transistors (referred to as NMOS transistors). Incidentally, in the drawings of the present disclosure, the PMOS transistor is distinguished from the NMOS transistor by marking a gate electrode with a circle. Further, when a channel type is not distinguished, the field effect transistor is hereinafter referred to as a MOS transistor.

The memory cell 11c includes a first inverter circuit IV1 composed of a PMOS transistor P1 and an NMOS transistor N1, and a second inverter circuit IV2 composed of a PMOS transistor P2 and an NMOS transistor N2. The first inverter circuit IV1 and the second inverter circuit IV2 are connected between a power supply line, to which a power supply voltage (Vd) is supplied, and a ground line to which a ground potential (Vs) is supplied. Further, an input of the first inverter circuit IV1 is connected to an output of the second inverter circuit IV2, and an input of the second inverter circuit IV2 is connected to an output of the first inverter circuit IV1. That is, the first inverter circuit IV1 and the second inverter circuit IV2 are cross-connected so as to form a latch circuit. Transfer NMOS transistors N3, N4 are connected between the inputs of the second inverter circuit IV2 and the first inverter circuit IV1 and one pair of complementary data lines (BT [0], BB [0]) 16a, 16b. Gate electrodes of the transfer NMOS transistors N3, N4 are connected to the word line (WL [0]) 17a.

The pair of complementary data lines 16a, 16b and a word line 17a are used in writing data to the memory cell That is, in writing data to the memory cell 11c, 11c, complementary voltages (high level and low level) according to logic values of data to be written are supplied to the complementary data lines 16a, 16b, and a high level is supplied to the word line 17a. Consequently, the complementary voltages on the pair of complementary data lines 16a, 16b are supplied to the latch circuit composed of the first inverter circuit IV1 and the second inverter circuit IV2 via the transfer NMOS transistors N3, N4. Thus, the logic value "0" or "1" is written to the memory cell 11c. The logic values held in the memory cell 11c are outputted from nodes n3, n4. The nodes n3, n4 are connected to gates of the NMOS transistors forming the switches 12e, 12f.

The memory cell 11a has the same configuration as the memory cell 11c, but the transfer NMOS transistors N3, N4 are connected to a pair of complementary data lines (BT [1], BB [1]) 16c, 16d different from the pair of complementary data lines 16a, 16b. The logic value held in the memory cell 11a is outputted only from the node n3. This makes it possible to write a logic value different from that of the memory cell 11c into the memory cell 11a. The node n3 is connected to the gates of the NMOS transistors forming the switches 12a, 12b.

The memory cell 11e has the same configuration as the memory cell 11c. However, the transfer NMOS transistors N3, N4 of the memory cell 11e are connected to a pair of complementary data lines (BT [2], BB [2]) 16e, 16f different from the pair of complementary data lines 16a, 16b and the pair of complementary data lines 16c, 16d. This makes it possible to write a logic value different from that of the memory cell 11c into the memory cell 11a. The logic value held in the memory cell 11e is outputted from the nodes n3, n4. The nodes n3, n4 are connected to the gates of the NMOS transistors forming the switches 12g, 12h.

The memory cell 11d has the same configuration as the memory cell 11c, but gate electrodes of the transfer NMOS transistors N3, N4 are connected to a word line (WL [1]) 17b different from the word line 17a. Consequently, setting the word line 17b to a high level at timing different from that of the word line 17a makes it possible to write a logic value different from that of the memory cell 11c into the memory cell 11d. A logic value held in the memory cell 11d is outputted from the nodes n3, n4. The nodes n3, n4 are connected to the gates of the NMOS transistors forming the switches 12g, 12h.

The memory cell 11b has the same configuration as the memory cell 11a, but the gate electrodes of the transfer NMOS transistors N3, N4 are connected to a word line 17b different from the word line 17a. Consequently, setting the word line 17b to a high level at timing different from that of the word line 17a makes it possible to write a logic value different from that of the memory cell 11a into the memory cell 11d. That is, the memory cell 11a used for storing the logic value "+1" in the product-operation memory cell 10 is controlled by the word line 17a, and the memory cell 11b used for storing the logic value "−1" in the product-operation memory cell 10 is controlled by the word line 17b. The logic value held in the memory cell 11b is outputted from the node n3. The node n3 is connected to the gates of the NMOS transistors forming the switches 12i, 12j.

The memory cell 11f has the same configuration as the memory cell 11e, but the gate electrodes of the transfer NMOS transistors N3, N4 are connected to the word line 17b different from the word line 17a. Consequently, setting the word line 17b to a high level at timing different from that of the word line 17a makes it possible to write a logic value different from that of the memory cell 11e into the memory cell 11f. A logic value held in the memory cell 11f is outputted from the nodes n3, n4. The nodes n3, n4 are connected to the gates of the NMOS transistors forming the switches 12o, 12p.

<Layout of Product-Operation Memory Cell (ME)>

Figure 6:
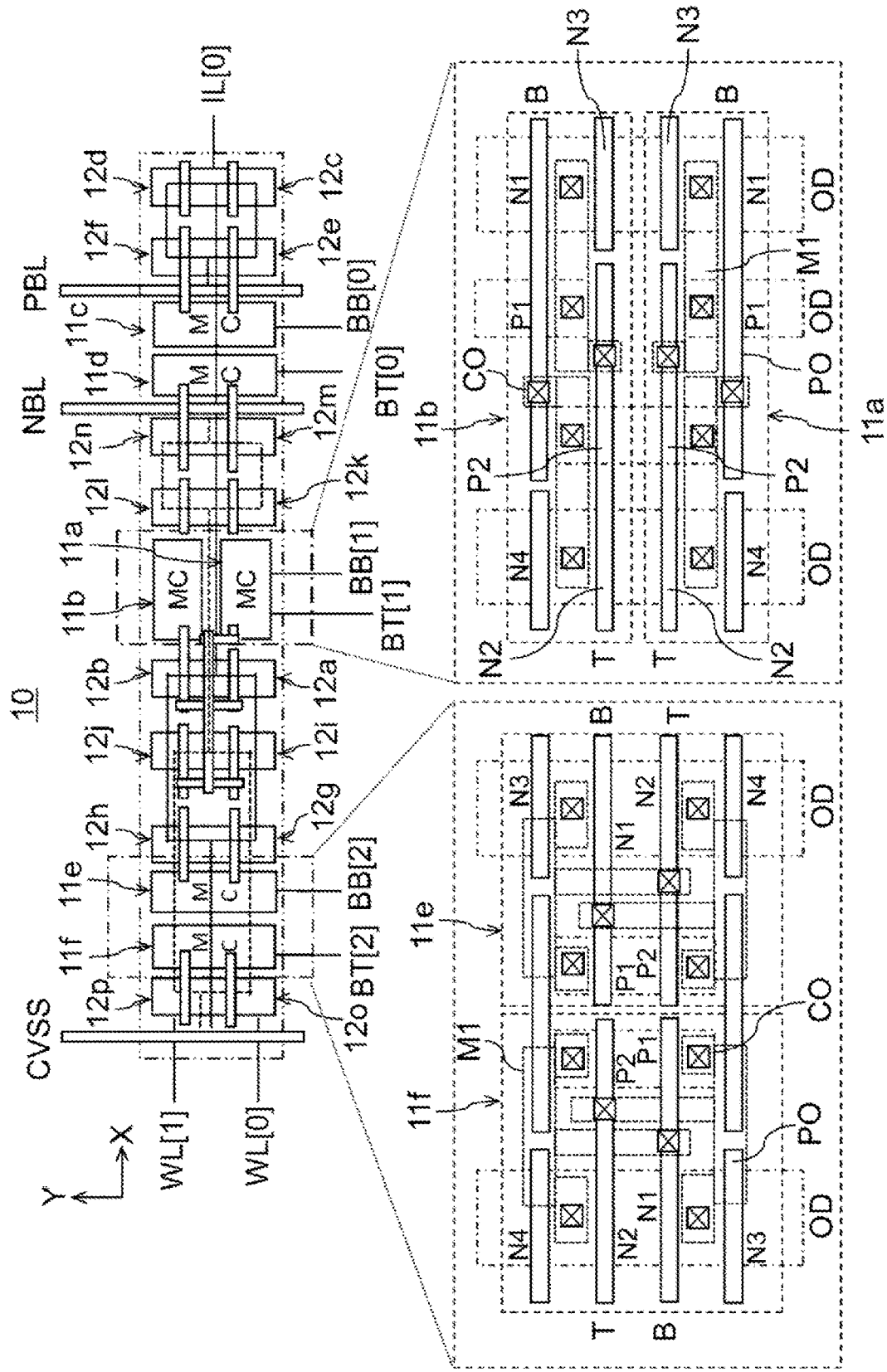
FIG. 6 is a plan view showing a layout of the product-operation memory cell shown in FIG. 5.

FIG. 6 is a plan view showing a layout example of a product-operation memory cell shown in FIG. 5.

A word line (WL [1:0]) and an input line (IL [0]) are arranged so as to extend along an X direction. A data line pair (BT [2:0], BB [2:0]), a common ground line (CVSS), a data line (PBL), and a data line (NBL) are arranged so as to extend along a Y direction orthogonal to the X direction.

The switches 12o, 12p are arranged on a left side of the memory cell 11f, and the common ground line (CVSS) is arranged on left sides of the switches 12o, 12p. The memory cell 11e is arranged on a right side of the memory cell 11f, and the switches 12g, 12h are arranged on the right side of the memory cell 11e.

The switches 12a, 12b are arranged on left sides of the memory cells 11a, 11b, and the switches 12l, 12j are arranged on left sides of the switches 12a, 12b. The switches 12k, 12l are arranged on the right sides of the memory cells 11a, 11b.

The data line (NBL) is arranged on the left side of the memory cell 11d, and the switches 12m, 12n are arranged on the left side of the data line (NBL). The memory cell 11c is arranged on the right side of the memory cell 11d. The data line (PBL) is arranged on the right side of the memory cell 11c, the switches 12e, 12f are arranged on the right side of the data line (PBL), and the switches 12c, 12d are arranged on the right sides of the switches 12e, 12f.

The two path switching memory cells 11f, 11e and the two memory cells 11d, 11c are respectively arranged alongside in the X direction, and the two weight memory cells 11a, 11b are arranged alongside in the Y direction. The complementary data line (BT, BB) can be shared between the adjacent memory cells.

The weight memory cells 11a, 11b use cells having layouts different from those of the path switching memory cells 11f, 11e and the memory cells 11d, 11c. The former uses a so-called horizontal SRAM cell, and the latter uses a vertical SRAM cell.

In FIG. 6, each region surrounded by solid lines indicates a wiring PO that forms the gate electrode of the MOS transistor, and each region surrounded by dash-singe-dot lines indicates a semiconductor region OD that forms a source region or drain region of the MOS transistor. Further, each region surrounded by dash lines indicates a metal wiring formed by a first metal wiring layer (conductive layer) M1. Furthermore, each region surrounded by solid lines and marked with x indicates a contact region CO. For example, two layers overlapping with the contact region CO are electrically connected therebetween by the contact region CO. The reference numerals of the PMOS transistor and the NMOS transistor described with reference to FIG. 5 are given to gate electrode portions. The gate electrode portion to which the reference numeral is given forms a gate electrode that configures the MOS transistor with the reference numeral.

The memory cell 11e, which is a vertical SRAM cell, will be described. The gate electrodes of the PMOS transistors P1, P2 and the NMOS transistors N3, N4 forming the memory cell 11e are arranged parallel to the X direction. Further, the gate electrodes forming the PMOS transistors P1, P2 are extended to form the gate electrodes of the NMOS transistors N1, N2, respectively. That is, the gate electrodes of the PMOS transistor P1 and the NMOS transistor N1 are integrally formed. The gate electrodes of the PMOS transistor P2 and the NMOS transistor N2 are integrally formed. The gate electrodes of the PMOS transistors P1, P2 are lined up in the Y direction. The gate electrodes of the NMOS transistors N1 to N4 are lined up in the Y direction. The adjacent memory cells 11f are arranged point-symmetrically with the memory cell 11e. The memory cells 11c, 11d are configured similarly to the memory cells 11e, 11f.

The memory cell 11a, which is a horizontal SRAM cell, will be described. The gate electrodes of the PMOS transistors P1, P2 and the NMOS transistors N3, N4 that form the memory cell 11a are arranged parallel to the X direction. Further, the gate electrodes forming the PMOS transistors P1, P2 are extended to form the gate electrodes of the NMOS transistors N1, N2, respectively. That is, the gate electrodes of the PMOS transistor P1 and NMOS transistor N1 are integrally formed. The gate electrodes of the PMOS transistor P2 and the NMOS transistor N2 are integrally formed. The gate electrodes of the PMOS transistors P1, P2 are lined up in the Y direction. The gate electrodes of the NMOS transistors N1, N3 are lined up in the Y direction. The gate electrodes of the NMOS transistors N2, N4 are lined up in the Y direction. The adjacent memory cells 11b are arranged line-symmetrically (in a mirror-inverted state) with the memory cells 11a.

Since the memory cells 11a to 11f are composed of six SRAM cells, a reduction in area overhead becomes important. Since the weight memory cells 11a, 11b are used for controlling only T nodes, they are configured by horizontal cells in which the T nodes of the two cells are on the same side. Then, since the path switching memory cells 11c to 11f use both a T node and a B node, they are configured by vertical cells in which the T node and the B node are on the same side. Those configurations can enhance wiring efficiency, thereby being able to reduce respective cell areas. Configurating the memory cells by concurrently using two types of SRAM layouts (vertical SRAM cell and horizontal SRAM cell) makes it possible to enhance area efficiency.

<Write of Logic value to Product-Operation Memory Cell (ME) and Product Operation>

Returning to FIG. 5, write of a logic value to the product-operation memory cell will be described.

In writing the logic value "+1" to the product-operation memory cell 10, the word line 17a is set to a high level in states of supplying a high level to the complementary data line 16c and supplying a low level to the complementary data line 16d. Consequently, the memory cell 11a is selected, the transfer NMOS transistors N3, N4 in the memory cell 11a become ON-states, and a low level is supplied to the input of the first inverter circuit IV1. As a result, the latch circuit in the memory cell 11a latches such a state as to make the node n3 a high-level state.

Subsequently, the word line 17b is set to a high level in states of supplying a high level to the complementary data line 16d and supplying a low level to the complementary data line 16c. Consequently, the memory cell 11b is selected, the transfer NMOS transistors N3, N4 in the memory cell 11b become ON-states, and a high level is supplied to the input of the first inverter circuit IV1. As a result, the latch circuit in the memory cell 11b latches such a state as to make the node n3 a low-level state.

Thus, the switches 12a, 12b become ON-states, and the switches 12l, 12j become OFF-stets. Further, if the input data (ID) supplied to the input line 15 is at, for example, a high level on the condition that the logic value "1" is written in the memory cells 11c, 11e, the switches 12c, 12d, 12e, and 12g become ON-states. Consequently, the switches 12e, 12c, 12a, and 12g lead to forming a current path(s) that allows a current to flow from the data line 13a to the common power supply line 14.

Although a case of writing the logic value "+1" to the product-operation memory cell 10 has been described, the same applies also to a case of writing the logic value "−1" and a case of writing the logic value "0". Here, it is assumed that the logic value "1" is written in the memory cells 11d, 11f. If the input data (ID) is at the high level in a case where the logic value "−1" is written in the product-operation memory cell 10, the switches 12m, 12k, 12i, and 12o lead to forming a current path(s) that connects the data line 13b and the common power supply line 14. Meanwhile, even if the input data (ID) is at the high level in a case where the logic value "0" is written in the product-operation memory cell 10, no current path that connects the data lines 13a, 13b and the common power supply line 14 is formed.

<Sum Operation>

As shown in FIG. 2, a large number of product-operation memory cells (ME) 10 are connected to the data lines 13a, 13b. Consequently, a current corresponding to the sum of the number of current paths formed in each product-operation memory cell 10 leads to flowing through the data lines 13a, 13b. That is, a current corresponding to the sum of product operations on a logic value "+1" side flows through the data line 13a, and a current corresponding to the sum of product operations on a logic value "−1" side flows through the data line 13b. Consequently, a result of the product-sum operation on the logic value "+1" side leads to being outputted to the data line 13a, and a result of the product-sum operation on the logic value "−1" side leads to being outputted to the data line 13b. Therefore, by analog/digital conversion (A/D conversion) of a difference between the current in the data line 13a and the current in the data line 13b, the expected results of the product-sum operations can be obtained. Of course, each current flowing through the data lines 13a, 13b may be A/D-converted and a difference between resulting digital signals may be obtained.

The product-operation memory cell 10 stores the three logic values of "+1", "0", and "−1" used in the product-sum operation. Therefore, data used in learning and inference can be prevented from being compressed too much, and accuracy of the learning and inference can be improved. In addition, even if the logic value stored in the product-operation memory cell 10 is not changed, changing the input data (ID) makes it possible to perform a large number of product-sum operations. Therefore, the number of data transfer processings can be reduced. Furthermore, since the sum operation is realized by the respective product-operation memory cells 10 drawing the currents from the data lines 13a, 13b, a plurality of sum operations in one operation can be performed. This makes it possible to further reduce the number of data transfer processings and reduce power consumption.

<Current Source (CS)>

Returning to FIG. 3, a current source (CS) will be described.

A current source (CS) 102 composed of PMOS transistors P3 to P6 is connected to one set of data lines 13a, 13b. The PMOS transistors P3, P6 have their source/drain paths connected between the data line 13a and a power supply of a voltage (Vd), and constitute a bias circuit for biasing the data line 13a. The PMOS transistors P4, P5 have their source/drain paths connected between the data line 13b and the power supply of the voltage (Vd), and constitute a bias circuit for biasing the data line 13b. A current is supplied to the data lines 13a, 13b via the current source 102.

<Common Power Supply Switch (CVSW)>

A ground potential (Vs) is supplied to the common power supply line (CVSS) 14 via the common power supply switch (CVSW) 103 shown in FIG. 3. The common power supply switch 103 is composed of an NMOS transistor N5, and a product-sum operation enable signal (MACE) is supplied to a gate of the NMOS transistor N5. A constant current source (CCS) may be connected instead of the ground potential (Vs).

<Sense Amplifier (SA)>

Further, the data lines 13a, 13b are connected to a latch-type sense amplifier (SA) 104 via a pair of transfer switches. The pair of transfer switches are composed of: NMOS transistors N7, N8 controlled by a comparison enable signal (CE); and PMOS transistors P7, P8 controlled by its inverted signal (/CE).

Also, the sense amplifier (SA) 104 is composed of an inverter circuit IV3 and an inverter circuit IV4 cross-connected thereto. The PMOS transistors P7, P8 and the NMOS transistors N7, N8 become ON-states by the comparison enable signal (CE) and its inverted signal (/CE). Consequently, a potential difference between the data lines 13a supplied via the pair of transfer switches and the data line 13b is amplified and are latched. That is, the sense amplifier 104 is a comparison circuit that compares a current value of the data line 13a and a current value of the data line 13b.

An output of the logic value "1" or "0" of the sense amplifier 104 is supplied to an inference control circuit 105.

<Inference Reference Cell (IREF)>

Figure 7:
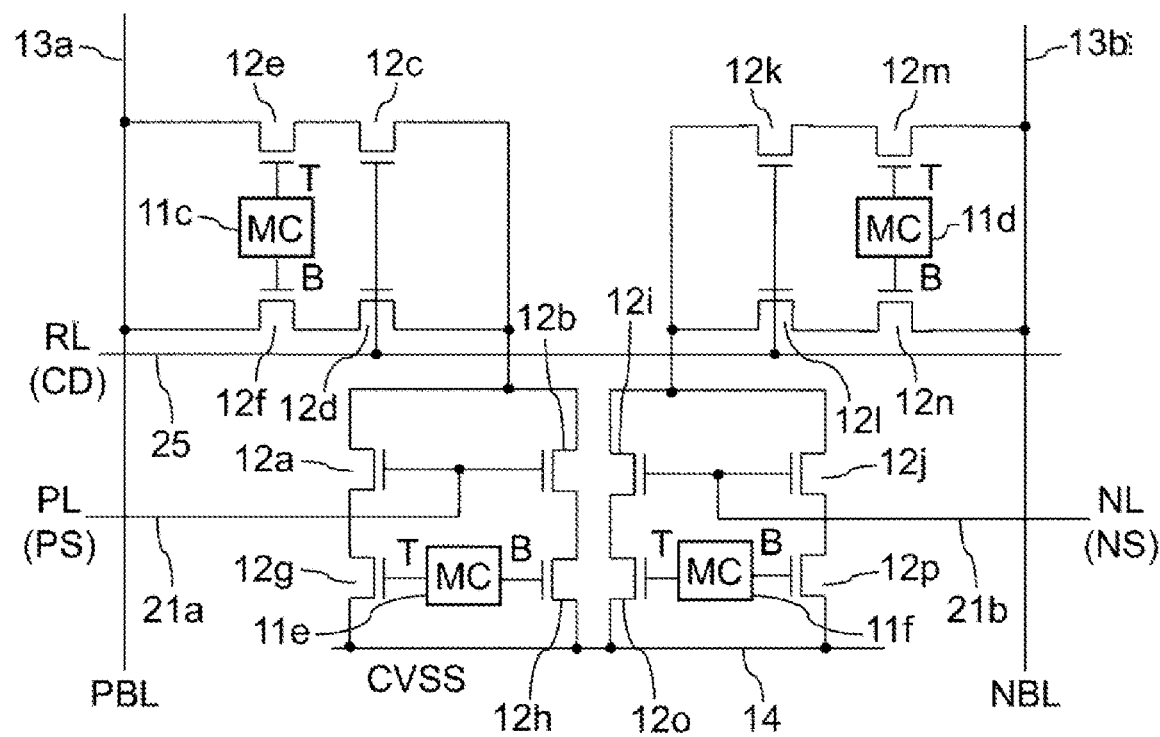
FIG. 7 is a diagram showing a configuration example of an inference reference cell shown in FIG. 3.

FIG. 7 is a diagram showing a configuration example of an inference reference cell shown in FIG. 3.

The inference reference cell 20 has a structure similar to that of the product-operation memory cell 10. Both cells are different in that a signal line (PL) 21a and a signal line (NL) 21b to which selection signals (PS, NS) instead of the outputs of the memory cells 11a, 11b are supplied are connected to the switches 12a, 12b, 12i, 12j. Another difference is in that a signal line (RL) 25 to which a control signal (CD) instead of the input line (IL) 15 is supplied is connected. By making the inference reference cell 20 similar in structure to the product-operation memory cell 10, the inference reference cell 20 is configured to have the same driving force as the product-operation memory cell 10 for the data lines 13a, 13b. The inference reference cell 20 also has an adjustment function for switching current paths.

<Adjustment Reference Cell (TREF)>

Figure 8:
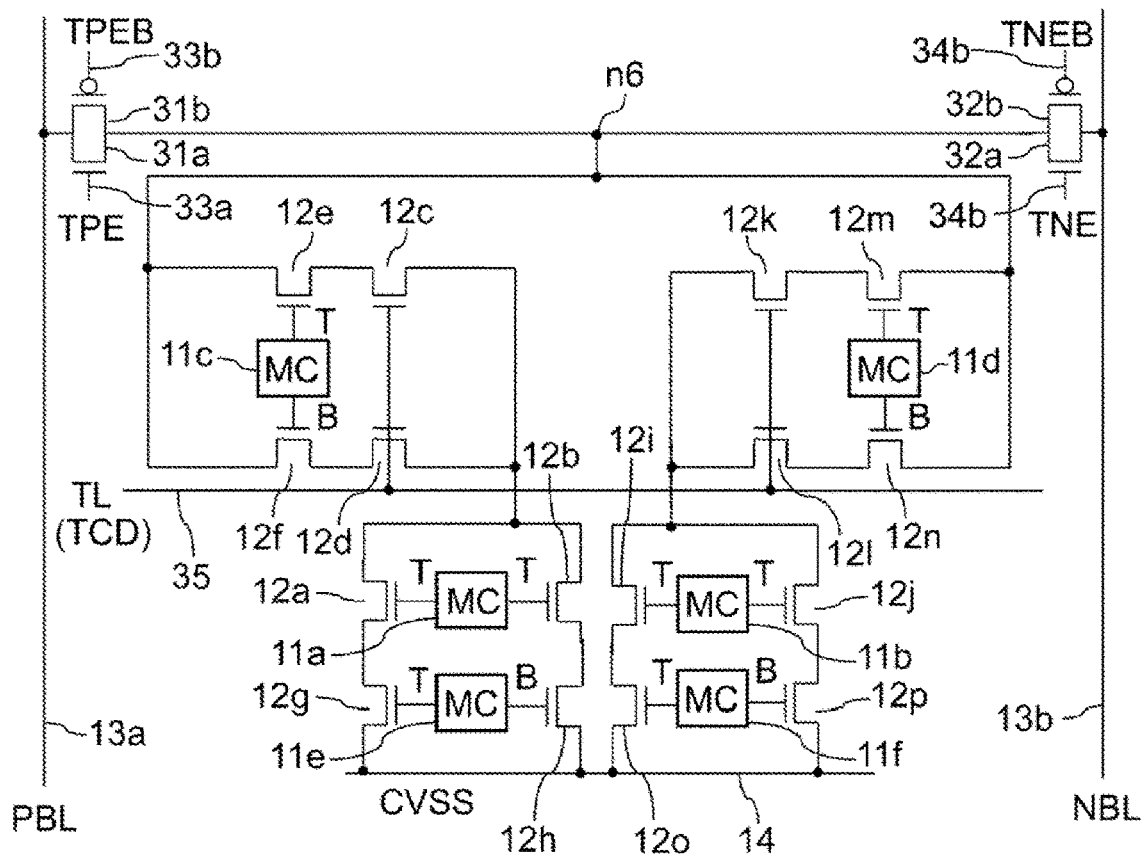
FIG. 8 is a diagram showing a configuration example of an adjustment reference cell shown in FIG. 3.

FIG. 8 is a diagram showing a configuration example of an adjustment reference cell shown in FIG. 3.

The adjustment reference cell 30 has a structure similar to that of the product-operation memory cell 10.

Both cells are different in that selection switches 31a, 31b are arranged between the data line 13a and the switches 12e, 12f. Another difference is in that selection switches 32a, 32b are arranged between the data line 13b and the switches 12m, 12n. Further another difference is in that the switches 12e, 12f, 12m, and 12n are connected to a common node n6. Yet another difference is in that a signal line (TL) 35 to which a control signal (TCD) instead of the input line (IL) 15 is supplied is connected.

When the selection signal (TPE) supplied to the signal line 33a is at a high level and the selection signal (TPEB) supplied to the signal line 33b is at a low level, the switches 31a, 31b connect the switches 12e, 12f, 12m, and 12n to the data line 13a. When the selection signal (TNE) supplied to the signal line 34a is at a high level and the selection signal (TNEB) supplied to the signal line 34b is at a low level, the switches 32a, 32b connect the switches 12e, 12f, 12m, and 12n to the data line 13b.

By making the adjustment reference cell 30 similar in structure to the product-operation memory cell 10, the adjustment reference cell 30 is configured to have the same driving force as the product-operation memory cell 10 for the data lines 13a, 13b.

The adjustment reference cell 30 has a function of switching current paths by using a plurality of memory cells similarly to the product-operation memory cell 10. Further, since the adjustment reference cell 30 is not used for the product-sum operation, all the six memory cells can be used for path switching. Eight current paths can be selected by providing selection switches 31a, 31b, 32a, and 32b connected to the data lines 13a, 13b. A current value close to that of the product-operation memory cell can be realized by adopting a circuit configuration that allows the path switching.

<Fine Adjustment Cell (FT)>

Figure 9:
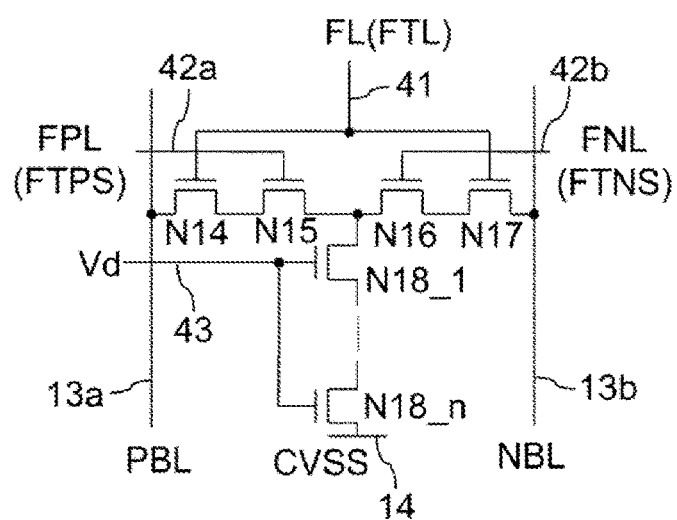
FIG. 9 is a diagram showing a configuration example of a fine adjustment cell shown in FIG. 3.

FIG. 9 is a diagram showing a configuration example of a fine adjustment cell shown in FIG. 3. A fine adjustment cell 40 is used to determine magnitude of a current.

The fine adjustment cell 40 includes NMOS transistors N14 to N17, and NMOS transistors N18_1 to N18_n. The NMOS transistors N14 to N17 have source/drain paths connected in series between the data lines 13a and 13b. The NMOS transistors N18_1 to N18_n have source 1 drain paths connected in series between a node connecting the NMOS transistors N15, N16 and the common power supply line 14. A signal line (FL) 41 to which a control signal (FTL) is supplied is connected to gate electrodes of the NMOS transistor N14, N17. Then, a signal line (FPL) 42a to which a selection signal (FTPS) is supplied is connected to a gate of the NMOS transistor N15. Then, a signal line (FNL) 42b to which a selection signal (FTNS) is supplied is connected to the gate of the NMOS transistor N16, and a power supply line 43 to which a power supply voltage (Vd) (or a pulsed control signal) is supplied is connected to the gates of the NMOS transistor N18_1 to N18_n.

Since the fine adjustment cell has the NMOS transistors N18_1 to N18_n connected in series in multiple stages, a very small amount of current can flow through the data lines 13a, 13b selected by the signal lines 42a, 42b. A plurality of minute current values can be selected by providing a plurality of fine adjustment cells (FT) 40 in which the number of stages in series (the number of NMOS transistors N18_1 to N18_n) is changed. For example, the minute current value is 1%, 2%, 5%, or the like of the current of the product-operation memory cell 10. Incidentally, the fine adjustment cell 40 also has a cell whose value is 50% of the current of the product-operation memory cell 10, so that it can also be used to determine magnitude of a current between the product-operation memory cell 10 and the inference reference cell 20, which will be described later.

<A/D Conversion>

By using one example, an operation of A/D conversion in a memory cell array 101 will be described with reference to FIGS. 7 and 10. FIG. 10 is a diagram for explaining A/D conversion. The A/D conversion is controlled by an inference control circuit 105, and is performed based on eight steps.

The inference reference cell 20 is controlled by eight control signals (CD [7:0]) outputted from the inference control circuit 105. In a case of an example shown in FIG. 10, one reference cell 20 is connected to a signal line to which a control signal (CD [0]) is supplied. Two reference cells 20 are connected to a signal line to which a control signal (CD [1]) is supplied. Four reference cells 20 are connected to a signal line to which a control signal (CD [2]) is supplied. Further, eight reference cells 20 are connected to a signal line to which a control signal (CD [3]) is supplied. Sixteen reference cells 20 are connected to a signal line to which a control signal (CD [4]) is supplied. Thirty-two reference cells 20 are connected to a signal line to which a control signal (CD [5]) is supplied. Sixty-four reference cells 20 are connected to a signal line to which a control signal (CD [6]) is supplied. That is, the control signal (CD [6:0]) is weighted. Furthermore, in order to detect a difference of 1 or less, one reference cell 20 whose driving force is halved (hereinafter referred to as a 0.5 cell) is connected to a signal line to which a control signal (CD [7]) is supplied.

As one example, a case where, by the product-sum operation, a product-sum value on a "+1" side is "32" and a product sum value on a "−1" side is "21" will be described. That is, a current on the data line 13a indicates a product-sum value of "32" (#PBL=32), and a current on the data line 13b indicates a product-sum value of "21" (#NBL=21). In this case, a difference between the product-sum values becomes "11". Output data (MQ [0]) corresponding to this difference is outputted from an AD conversion control logic unit (ADC) 105a of the inference control circuit 105.

At a first step (1st), the sense amplifier 104 as a comparison circuit compares the currents of the data lines 13a, 13b. Since "32">"21", the control logic unit 105a outputs, as output data (MQ [0]), a logic value "0" indicating the sign "+". Also, since the current of the data line 13a is larger, the control logic unit 105a sets the selection signal (NS) to a high level and the selection signal (PS) to a low level. Further, the control logic unit 105a makes the 0.5 cell in a state of being able to be connected to the data line 13a and makes the specified number of inference reference cells 20 in a state of being able to be connected to the data line 13b. The specified number here is "64". Here, by setting the selection signal (NS), which is supplied to the signal line 21b of the specified inference reference cell 20, to the high level, the switches 12k, 12l become ON-states, and the common power supply line (CVSS) become a state of being able to be connected to the data line 13b via the switch of the specified inference reference cell 20. In addition, by setting the selection signal (PS), which is supplied to the signal line 21a of the 0.5 cell, to the high level, the switches 12a, 12b become ON-states, and the common power supply line (CVSS) becomes a state of being able to be connected to the data line 13a via the switch of the 0.5 cell. Thereafter, by setting the signal line (RL) 25 to a high level, the switches 12c, 12d, 12k, and 12l are made ON-states, and the common power supply line (CVSS) is connected to the data line via the switches. This state is called "the cell has been connected to the data line".

In a second step (2nd), the control logic unit 105a makes the switches 12c, 12d of the 0.5 cell On-states by the signal line (RL) 25, and the 0.5 cell is connected to the data line 13a. The control logic unit 105a also makes the switches 12k, 12l of the sixty-four inference reference cells 20 ON-states by the signal line (RL) 25 and connects the sixty-four inference reference cells to the data line 13b. Consequently, a value on the data line 13a becomes "32+α", and a value on the data line 13b becomes "21+64=85". where α is a current value added by the 0.5 cell and is less than 1. The sense amplifier 104 compares "32+α" and "85". As a result of the comparison, the value of the data line 13b increases, so that the control logic unit 105a outputs a logic value "0" as the output data (MQ [0]).

In a third step (3rd), the control logic unit 105a specifies, as the specified number, "32" that is a half of "64", and makes the switches 12k, 12l in ON-states by the control signal (CD) supplied to the signal line 25. Consequently, the value of the data line 13a is "32+α" as before, but the value of the data line 13b becomes "21+32=53". Since the comparison by the sense amplifier 104 determines that the value of the data line 13b is large, the control logic unit 105a outputs the logic value "0" as the output data (MQ [0]).

In a fourth step (4th), the control logic unit 105a specifies "16" as the number of inference reference cells 20. Consequently, the value of the data line 13a is "32+α" as before, but the value of the data line 13b becomes "21+16=37". Since the comparison by the sense amplifier 104 determines that the value of the data line 13b is large, the control logic unit 105a outputs the logic value "0" as the output data (MQ [0]).

Also in a fifth step (5th), the control logic unit 105a specifies the number of inference reference cells 20 and outputs the control signal (CD) to the signal line 25, as in the fourth step (4th). However, in the fifth step (5th), the control logic unit 105a specifies, as the number of inference reference cells 20, "8" that is a half of a case of the fourth step. Consequently, the sense amplifier 104 compares the value "32+α" on the data line 13a with the value "21+8=29" on the data line 13b. In the fifth step (5th), the value of the data line 13a becomes larger than the value of the data line 13b, so that the control logic unit 105a outputs the logic value "1" as the output data (MQ [0]).

In the fifth step (5th), "8" has been added to the value on the data line 13b, but the value on the data line 13a has become larger than the value on the data line 13b. In a sixth step (6th), the control logic unit 105a specifies "8+4=12" as the number of inference reference cells 20. Consequently, the value of the data line 13a is "32+α" as before, but the value of the data line 13b becomes "21+12=33". Since the comparison by the sense amplifier 104 determines that the value of the data line 13b is large, the control logic unit 105a outputs the logic value "0" as the output data (MQ [0]).

In a seventh step (7th), the control logic unit 105a specifies "8+2=10" as the number of inference reference cells 20. Consequently, the value of the data line 13a is "32+α" as before, but the value of the data line 13b becomes "21+10=31". Since the comparison by the sense amplifier 104 determines that the value of the data line 13a is larger than the value of the data line 13b, the control logic unit 105a outputs the logic value "1" as the output data (MQ [0]).

In a seventh step (7th), "8+2" has been added to the value on the data line 13b, but the value on the data line 13a has become larger than the value on the data line 13b. In an eighth step (8th), the control logic unit 105a specifies "8+2+1=11" as the number of inference reference cells 20. Consequently, the value of the data line 13a is "32+α" as before, but the value of the data line 13b become "21+11=32". Since the comparison of the sense amplifier 104 determines that the value of the data line 13a is larger than the value of the data line 13b, the control logic unit 105a outputs the logic value "1" as the output data (MQ [0]).

As described above, the current values of the data lines 13a, 13b are compared while changing the specified number of inference reference cells 20. By the comparison, when the value of the data line 13a is larger than the value of the data line 13b, the control logic unit 105a outputs the logic value "1" as the output data (MQ [0]). Then, when the value of the data line 13b is larger than the value of the data line 13a, the control logic unit 105a outputs the logic value "0" as the output data (MQ [0]).

Consequently, the result of the product-sum operation is converted to serial 8 bits. Incidentally, a first bit is a sign bit and, following the sign bit, bits are outputted sequentially from the most significant bit toward the least significant bit. In an example shown in FIG. 10, an output (Output) that is the AD conversion result is 0b0000_1011=11 (=32-21).

Thus, by using the bisection method, a difference between the currents of the data lines 13a, 13b is searched, and its result is converted to a serial digital signal and is outputted. The processing can be terminated when a data length of the output data (MQ [0]) shown in FIG. 10 reaches a data length desired by the user. This makes it possible to reduce power and time required for useless A/D conversion.

Figure 11:
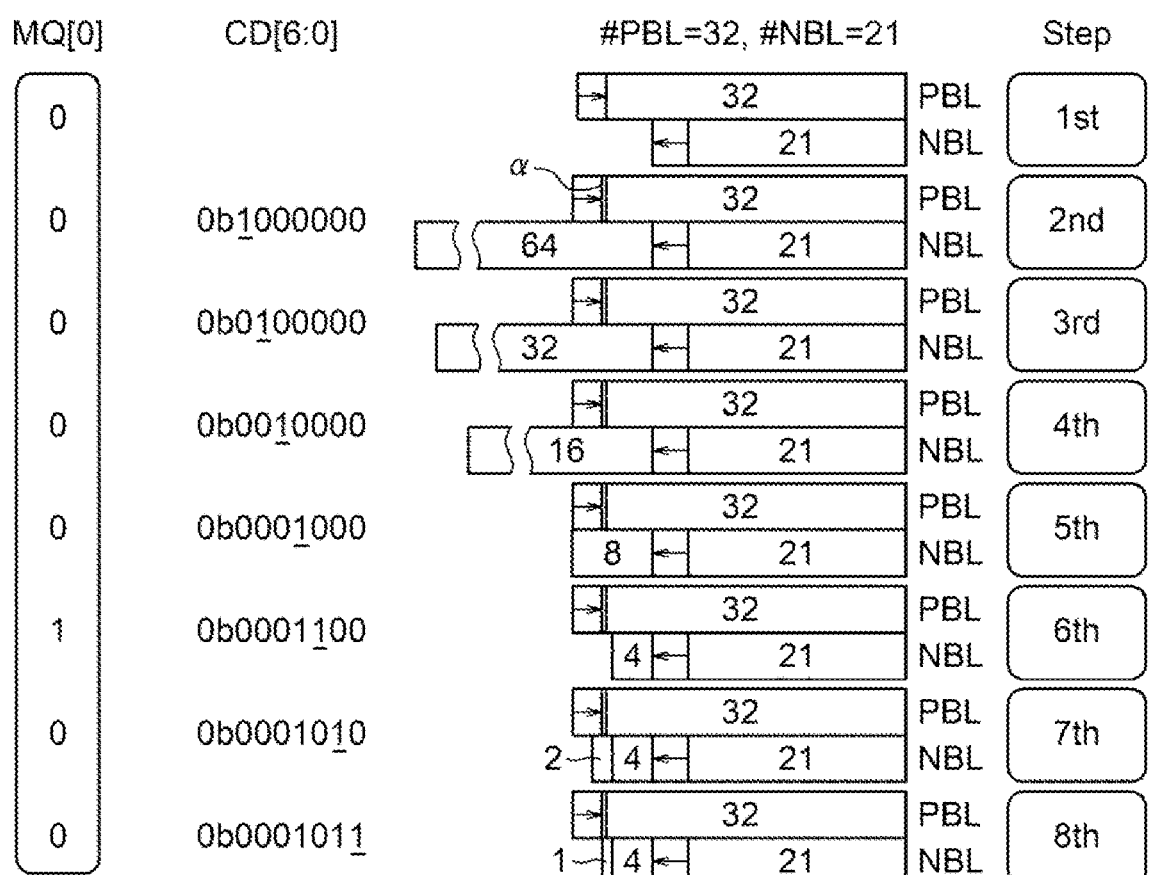
FIG. 11 is a diagram for explaining the A/D conversion when an error occurs.

The current of the reference cell is added to the current of the data line with the smaller current and is compared by using the bisection method, so that when the number of product-operation memory cells to be connected to the data line is great, the variations in currents of the product-operation memory cell are superimposed and errors at a higher level are generated. This will be described with reference to FIG. 11. FIG. 11 is a diagram for explaining A/D conversion when an error occurs.

As in the case shown in FIG. 10, described will be a case where a product-sum value on a "+1" side is "32" and a product-sum value on a "−1" side is "21" by the product-sum operation. Due to variations in memory cell current, the value of the data line 13a decreases by β as indicated by a rightward arrow "−", and the value of the data line 13b increases by γ as indicated by a leftward arrow "←". That is, the value of the data line 13a becomes "32-β" and the value of the data line 13b becomes "21+γ".

In an example shown in FIG. 11, an influence of the variations in memory cell current does not appear until a fourth step (4th). First to fourth steps are the same as in the case shown in FIG. 10.

In a fifth step (5th), the control logic unit 105a specifies "8" as the number of inference reference cells 20. Consequently, the value of the data line 13b becomes "21+γ+8=29+γ". The value of the data line 13a is "32+α-β". Here, for example, assuming that 0<α<1, β=4, and γ=3, the value "32+α-β" on the data line 13a becomes "28+α", and the value "29+γ" of the data line 13b becomes "32". Since 0<α<1, the comparison by the sense amplifier 104 determines that the value of the data line 13b is large. Therefore, the control logic unit 105a outputs a logic value "0" as the output data (MQ [0]).

Also in a sixth step (6th), the number of inference reference cells 20 is specified to "4" that is a half of the case of the fifth step. Consequently, the value of the data line 13b becomes "21+γ+4=25+γ". The value on the data line 13a is "32+α-β". Since β=4 and γ=3, the value "32+α-β" on the data line 13a becomes "28+α", and the value "25+γ" on the data line 13b becomes "28". Since 0<α<1, the comparison of the sense amplifier 104 determines that the value of the data line 13a becomes larger than the value of the data line 13b. Therefore, the control logic unit 105a outputs the logic value "1" as the output data (MQ [0]).

In a seventh step (7th), the control logic unit 105a specifies "4+2=6" as the number of inference reference cells 20. Consequently, the value of the data line 13a is "32+α-β" as before, but the value of the data line 13b becomes "21+γ+6=27+γ". Since β=4 and γ=3, the value "32+α-β" of the data line 13a becomes "28+α", and the value "27+γ" of the data line 13b becomes "30". Since 0<α<1, the comparison of the sense amplifier 104 determines that the value of the data line 13b is large. Therefore, the control logic unit 105a outputs the logic value "0" as the output data (MQ [0]).

In an eighth step (8th), the control logic unit 105a specifies "4+1=5" as the number of inference reference cells 20. Consequently, the value of the data line 13a is "32+α-β" as before, but the value of the data line 13b becomes "21+γ+5=26+γ". Since β=4 and γ=3, the value "32+α-β" of the data line 13a becomes "28+α", and the value "26+γ" of the data line 13b becomes "29". Since 0<α<1, the comparison of the sense amplifier 104 determines that the value of the data line 13b is large. Therefore, the control logic unit 105a outputs the logic value "0" as the output data (MQ [0]).

In an example shown in FIG. 11, an output (Output) that is a result of AD conversion becomes 0b0000_0100=4, which is different from the normal value "32-21=11", and an error occurs.

<Adjustment Operation>

Current adjustment of the product-operation memory cell 10 and the inference reference cell 20, which use the adjustment reference cell 30 and the fine adjustment cell 40, will be described with reference to FIGS. 12A, 12B, and 13 to 15.

Figure 12A:
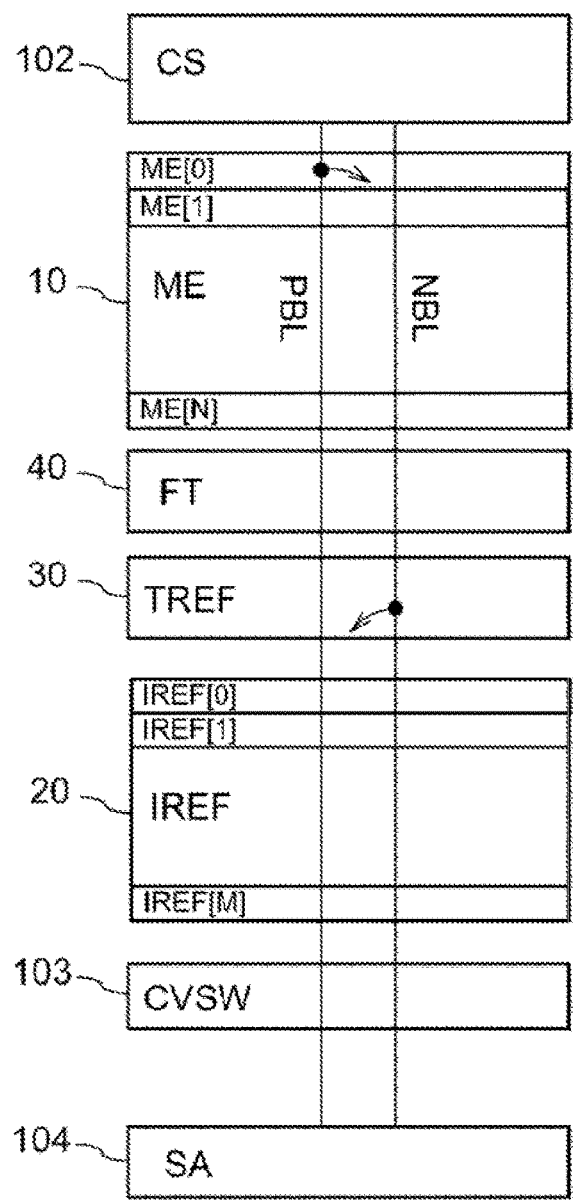
FIG. 12A is a diagram for explaining current comparison between the product-operation memory cell and the adjustment reference cell.
Figure 12B:
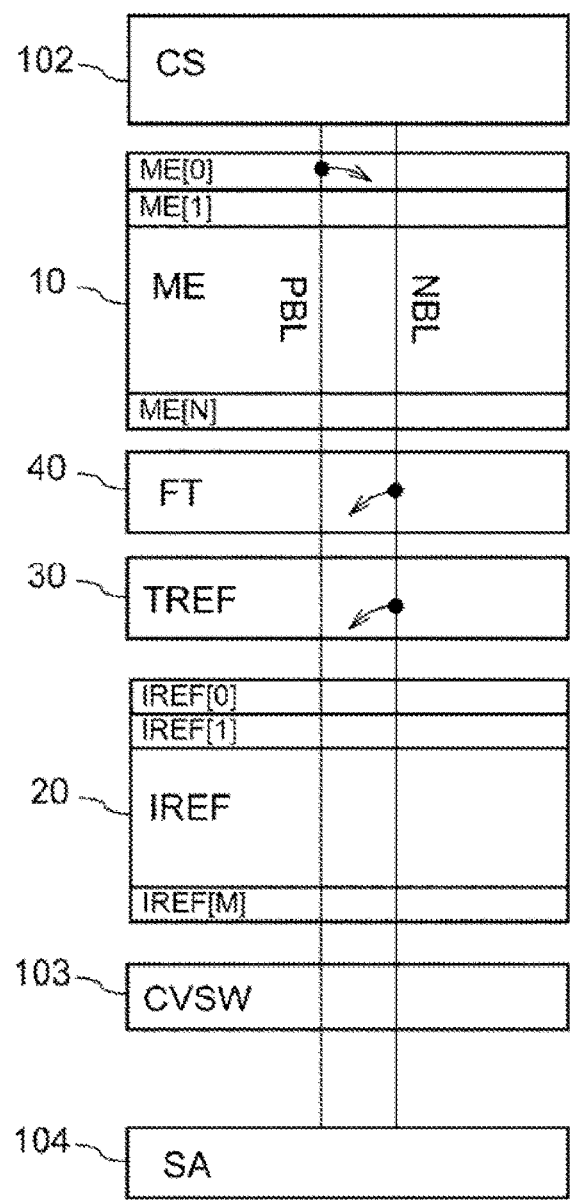
FIG. 12B is a diagram for explaining current comparison between the product-operation memory cell and the adjustment reference cell.
Figure 13:
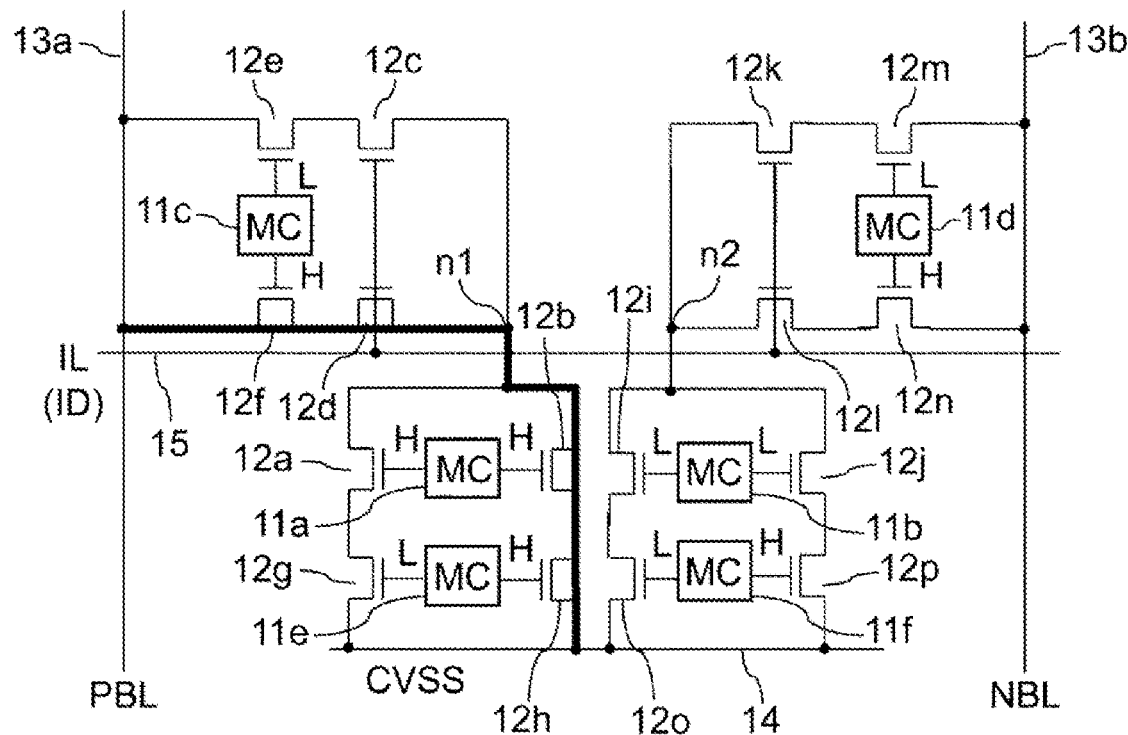
FIG. 13 is a diagram showing current paths of a product-operation memory cell (ME [0]).
Figure 14:
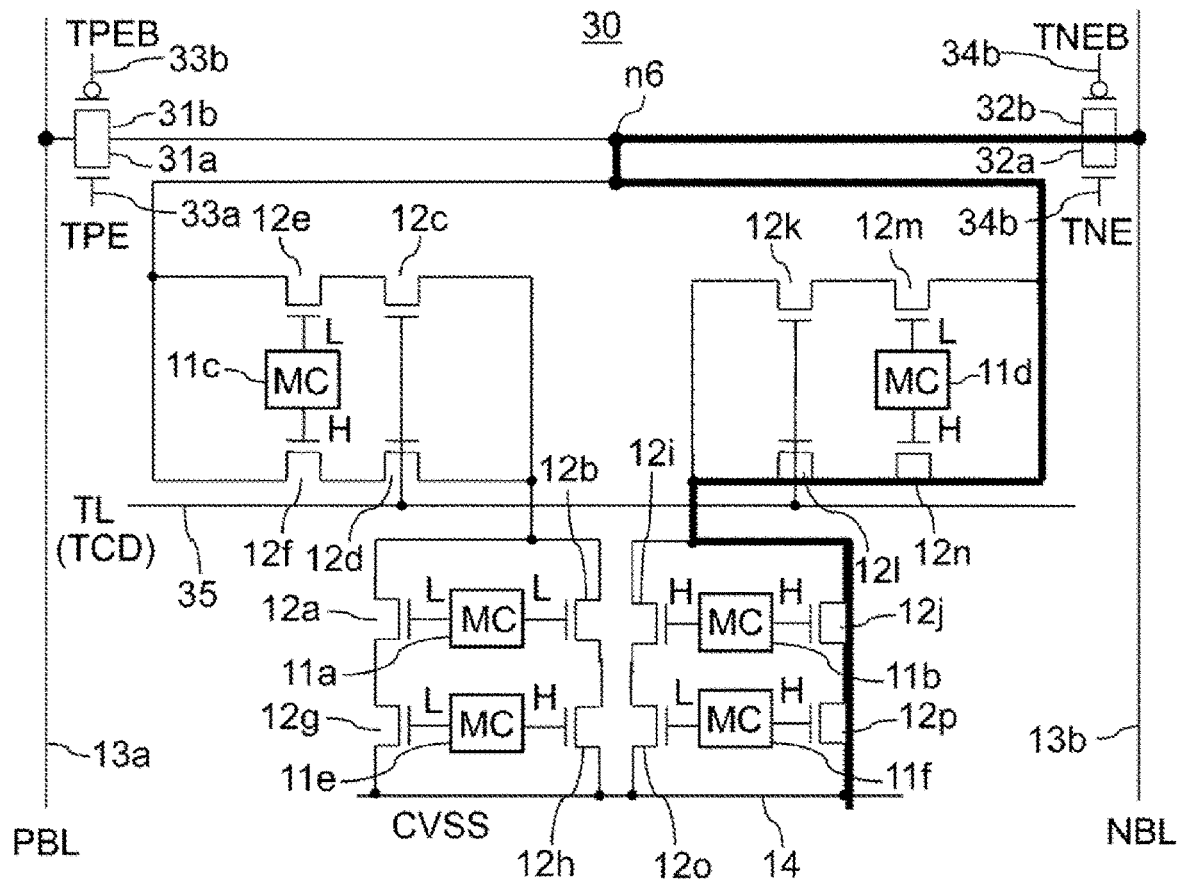
FIG. 14 is a diagram showing current paths of the adjustment reference cell.
Figure 15:
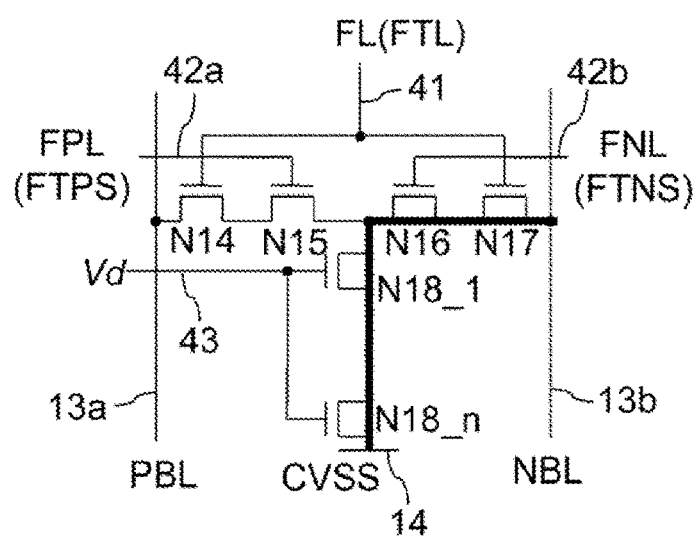
FIG. 15 is a diagram showing current paths of the fine adjustment cell.

FIG. 12A is a diagram for explaining current comparison between the product-operation memory cell and the adjustment reference cell. FIG. 12B is a diagram for explaining current comparison in which a fine adjustment cell is added to the product-operation memory cell and the adjustment reference cell. FIGS. 12A and 12B show examples in each of which the number of product-operation memory cells (ME [N:0]) 10 is (N+1) and the number of inference reference cells (IREF [M:0]) 20 is (M+1). Here, N and M are natural numbers. FIG. 13 is a diagram showing current paths of a product-operation memory cell (ME [0]). FIG. 14 is a diagram showing current paths of an adjustment reference cell. FIG. 15 is a diagram showing current paths of a fine adjustment cell.

(Step 0)
The logic value "0" is written into all the pass selection memory cells 11c to 11f of the product-operation memory cells 10 and the inference reference cells 20 to perform an initialization.

(Step 1)
One product memory cell 10 or inference reference cell 20 is selected, and the data line 13a or data line 13b connected by the weight memory cells 11a, 11b is selected. As one example, as shown in FIG. 12A, a product-operation memory cell (ME [0]) is selected. Further, as shown in FIG. 13, a logic value of "1" is written in the weight memory cell 11a, a logic value of "0" is written in the memory cell 11b, and the data line 13a is connected. Since the logic value "0" is written in the memory cells 11c to 11f, a current path is formed as indicated by a thick solid line in FIG. 13.

(Step 2)
A comparison operation is performed by connecting the adjustment reference cell 30 on a side of a data line different from the data line to which the product-operation memory cell 10 or inference reference cell 20 as an adjustment target cell is connected. At this time, the fine adjustment cell 40 is set not to be connected to any of the data lines 13a, 13b by the control signal (FTL). A sense amplifier 104 connected to the data lines 13a, 13b determines magnitude of the current value of the data line 13a and the current value of the data line 13b, and an output of the sense amplifier 104 is stored in a register.

Since the data line 13a of the product-operation memory cell 10 is selected in step 1, the data line 13b is selected in the adjustment reference cell 30. That is, selection signals (TNE), (TPEB) are set to high levels, selection signals (TNEB), (TPE) are set to low levels, and the data line 13b is connected. As shown in FIG. 14, for example, the logic value "0" is written into the memory cell 11a, and the logic value "1" is written into the memory cell 11b. Since the logic value "0" is written in the memory cells 11c to 11f, a current path is formed as indicated by a thick solid line in FIG. 14.
(Step 3)

With a first comparison result in step 2, the comparison operation is performed again while the fine adjustment cell 40 is connected on a side of the data line with the smaller current. When the current values of the adjustment reference cell 30 and the product-operation memory cell 10 are very close, addition of the current to the fine adjustment cell 40 changes the comparison result, so that detection of the change determines that the adjustment reference cell 30 and the product-operation memory cell 10 have matched each other.

FIG. 12B shows a case where the current flowing through the data line 13b is small and, in the fine adjustment cell 40, the data line 13b is selected. That is, the control signal (FTL) and the selection signal (FTNS) are set to high levels, the data line 13b is connected, and a current path is formed as indicated by a thick solid line in FIG. 15.
(Step 4)

If the currents of the product-operation memory cell 10 and the adjustment reference cell 30 match each other, this step proceeds to the next cell to perform adjustment after step 1. If they do not match, the logic value written in the pass selection memory cells 11c to 11f is changed to switch a path in the corresponding cell and the operations after step 2 are repeated. A current path of the product-operation memory cell 10, which has a current matching the current of the adjustment reference cell 30, is searched. If a current matching the current of the adjustment reference cell 30 does not exist even after searching all the current paths of the product-operation memory cell 10 or inference reference cell 20 selected in step 1, the logic vales of the memory cells 11a to 11f of the adjustment reference cell 30 are changed to switch the current paths in the adjustment reference cells and path selection of all the product-operation memory cells 10 and the inference reference cells 20 after step 0 is redone.

In this way, the currents of all the product-operation memory cells (ME [N:0]) and the inference reference cells (IREF [M:0]) can be adjusted with reference to a current path of one adjustment reference cell.

According to the embodiments, one or more of the following advantages can be obtained.
(1) The pass switching makes it possible to change characteristic values of the product-operation memory cell and the inference reference cell.
(2) The characteristic values of the product-operation memory cell and the inference reference cell can be maintained by the memory cell as a data holding circuit.
(3) The variations in currents of the product-operation memory cells can be reduced, so that malfunctions during the inference can be prevented.
(4) Performing periodical adjustment makes it possible to prevent malfunctions due to time degradation of transistors.
(5) Since operating conditions can be adjusted so as to suit usage environment such as temperature, reliability can be improved.

Modification Example

Some representative modification examples of the embodiment will be illustrated below. In descriptions of the following modification examples, it is assumed that the same reference numerals as those in the above-mentioned embodiment can be used for portions having the same configurations and functions as those described in the above-mentioned embodiment. Then, it is assumed that the descriptions of the portions can use the description in the above-mentioned embodiment as appropriate within a technically consistent range. Also, part of the above-mentioned embodiments and all or part of a plurality of modification examples can be appropriately applied in combination within a technically consistent range.

First Modification Example

Figure 16:
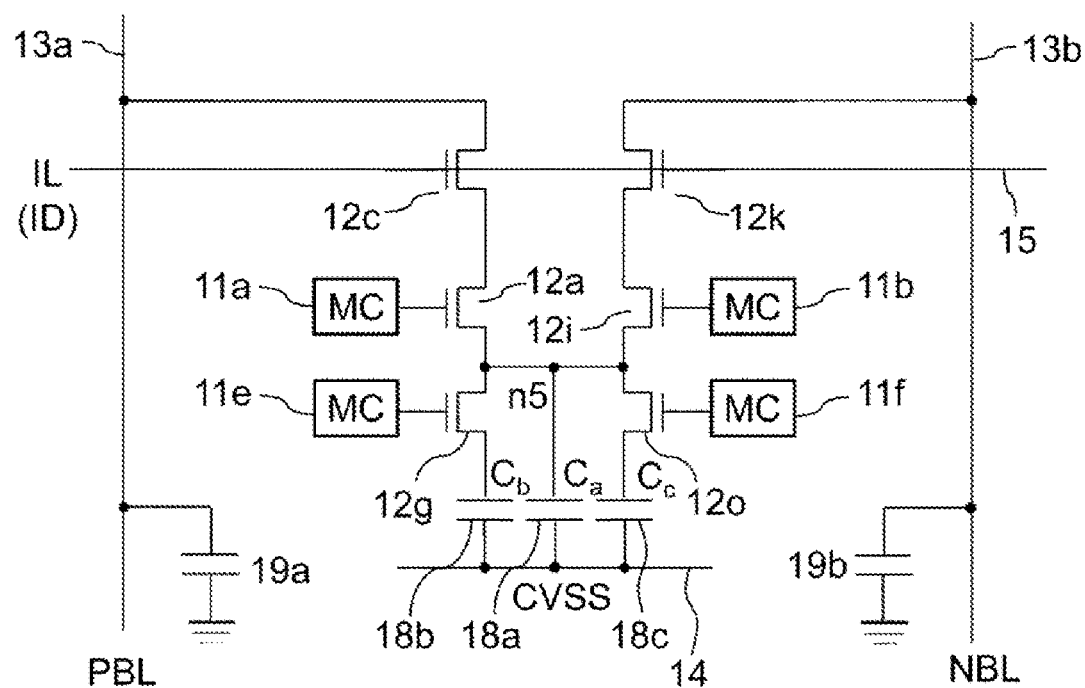
FIG. 16 is a diagram showing a configuration of a product-operation memory cell in a first modification example.

FIG. 16 is a circuit diagram showing a configuration of a product-operation memory cell 10 in a first modification example. A product-operation memory cell 10 in a first modification example is an example of a cell adapted to capacitive sensing in order to use capacitance to perform AD conversion (perform an sum operation by using a voltage (capacity)).

The product-operation memory cell 10 in the first modification example includes: four memory cells (MC) 11a, 11b, 11e, 11f; switches 12a, 12i corresponding to the memory cells 11a, 11b; and switches 12c, 12k controlled based on input data (ID) supplied to an input line (IL). The product-operation memory cell 10 further includes: switches 12g, 12o corresponding to the memory cells 11e, 11f; a main capacitive element 18a; and adjustment capacitive elements 18b, 18c corresponding to the memory cells 11e, 11f. It is assumed that a capacitance value of the main capacitance element 18a is Ca, a capacitance value of the capacitive element 18b is Cb, and a capacitance value of the capacitive element 18c is Cc, where Cb, Cc<<Ca.

As described with reference to FIG. 4, the memory cell 11a is used to store the logic value "+1" in the product-operation memory cell 10, and the memory cell 11b is used to store the logic value "−1" in the product-operation memory cell 10. The output of the memory cell 11a is supplied to the switch 12a. The output of the memory cell 11b is supplied to the switch 12i. The output of the memory cell 11e is supplied to the switch 12g. The output of the memory cell 11f is supplied to the switch 12o. The input data (ID) is supplied to the switch 12c. The input data (ID) is supplied to the switch 12k.

A node n5, which is a connection point between the switches 12a and 12f, is connected to one electrode of the main capacitive element 18a. The node n5 is connected to one electrode of the capacitive element 18b via the switch 12g, and the node n5 is connected to one electrode of the capacitive element 18c via the switch 12o. A common power supply line (CVSS) is connected to the other electrodes of the main capacitive element 18a, the capacitive element 18b, and the capacitive element 18c. The node n5 is connected to the data line 13a via switches 12a, 12c, and is connected to the data line 13b via the switches 12l, 12k. A precharge circuit (not shown) to which a power supply voltage (Vd) is supplied is connected to the common power supply line 14. A precharge circuit (not shown) to which a power supply voltage (Vd) is supplied is also connected to the data lines 13*a*, 13*b*.

When the input data (ID) is at a low level, the switches 12*c*, 12*k* become OFF-states and one electrode of the main capacitive element 18*a* is electrically separated from the data line 13*a* and the data line (NBL) 13*b*.

Next, when the input data (ID) becomes a high level, the switches 12*c*, 12*k* become ON-states so as to be able to electrically connect the data lines 13*a*, 13*b* to one electrode of the main capacitive element 18*a*. When the logic value "1" is stored in the memory cell 11*a* and the switch 12*a* becomes an ON-state, the main capacitive element 18*a* is connected to the data line 13*a*. Consequently, electric charges are dispersed between a parasitic capacitance 19*a* etc. of the data line 13*a* and the main capacitive element 18*a*, and the voltage of the data line 13*a* is determined. When the logic value "1" is stored in the memory cell 11*b* and the switch 12*i* becomes an ON-state, the main capacitive element 18*a* is connected to the data line 13*b*. Consequently, the voltage of the data line 13*b* is determined by charge dispersion between the main capacitive element 18*a* and a parasitic capacitance 19*b* etc. of the data line 13*b*.

Next, a case where a result of the product operations in the product-operation memory cell 10 becomes "0", "+1" and "−1" will be described.

The result of the product operations becomes "0" when the input data (ID) is "O" or when the data stored in both memory cells 11*a*, 11*b* are "0". At this time, the switches 12*c*, 12*k* are set to OFF-states or the switches 12*a*, 12*i* are set to OFF-states. Consequently, the main capacitive element 18*a* is shielded from the data lines 13*a*, 13*b*.

Meanwhile, the result of the product operations becomes "+1" when the input data (ID) is "1", the data stored in the memory cell 11*a* is "1", and the data stored in the memory cell 11*b* is "0". At this time, the switches 12*c*, 12*k* are set to ON-states, the switch 12*a* is set to an ON-state, and the switch 12*i* is set to an OFF-state. Consequently, the main capacitive element 18*a* is connected to the data line 13*a* and shielded from the data line 13*b*.

The result of the product operations becomes "−1" when the input data (ID) is "1", the data stored in the memory cell 11*a* is "0", and the data stored in the memory cell 11*b* is "1". At this time, the switches 12*c*, 12*k* are set to ON-states, the switch 12*a* is set to an OFF-state, and the switch 12*i* is set to an ON-state. Consequently, the main capacitive element 18*a* is shielded from the data line 13*a* and connected to the data line 13*b*.

A plurality of product-operation memory cells 10 are connected to the data lines 13*a*, 13*b*. Therefore, a difference between the number of main capacitive elements 18*a* charged to the power supply voltage (Vd) connected to the data line 13*a* and the number of main capacitive elements 18*a* charged to the power supply voltage (Vd) connected to the data line 13*b* becomes a product-sum result. In this case, since no current flows, determination is made at high impedance (Hi-Z). At the time of inference, the product-sum operations are performed by using the capacitance of the product-operation memory cell 10 conducted to the parasitic capacitance 19*a* of the data line 13*a* and the parasitic capacitance 19*b* of the data line 13*b*. Specifically, a difference in voltage between the data lines 13*a* and 13*b* becomes the product-sum result.

In order to adjust the variations in the capacitance of the main capacitive element 18*a* connected to the data lines 13*a*, 13*b*, adjustment capacitive elements 18*b*, 18*c* are connected to the main capacitive element 18*a*, and a suitable synthesis capacity is configured by path switching. This configuration makes it possible to switch the capacitance of the data line 13*a*, 13*b* in four ways. A specific description will be given below.

When the logic value "0" is stored in the memory cell 11*e* and the logic value "0" is stored in the memory cell 11*f*, the switches 12*g*, 12*o* are set to the OFF-states. Consequently, only one electrode of the main capacitive element 18*a* is connected to the node n5.

When the logic value "1" is stored in the memory cell 11*e* and the logic value "0" is stored in the memory cell 11*f*, the switch 12*g* is set to the ON-state and the switch 12*o* is set to the OFF-state. Consequently, one electrode of the main capacitive element 18*a* and one electrode of the capacitive element 18*b* are connected to the node n5.

When the logic value "0" is stored in the memory cell 11*e* and the logic value "1" is stored in the memory cell 11*f*, the switch 12*g* is set to the OFF-state and the switch 12*o* is set to the ON-state. Consequently, one electrode of the main capacitive element 18*a* and one electrode of the capacitive element 18*c* are connected to the node n5.

When the logic value "1" is stored in the memory cell 11*e* and the logic value "1" is stored in the memory cell 11*f*, the switch 12*g* is set to the ON-state and the switch 12*o* is set to the ON-state. Consequently, one electrode of the main capacitive element 18*a*, one electrode of the capacitive element 18*b*, and one electrode of the capacitive element 18*c* are connected to the node n5.

Although capacity determination is used in this modification example, the characteristic value can be changed as in the embodiment and the value can be maintained by the memory cell. Further, adjusting the characteristics of the plurality of product-operation memory cells, which is connected to the same data line, to a reference value by the adjustment function makes it possible to prevent malfunction during the inference.

Second Modification Example

Figure 17:
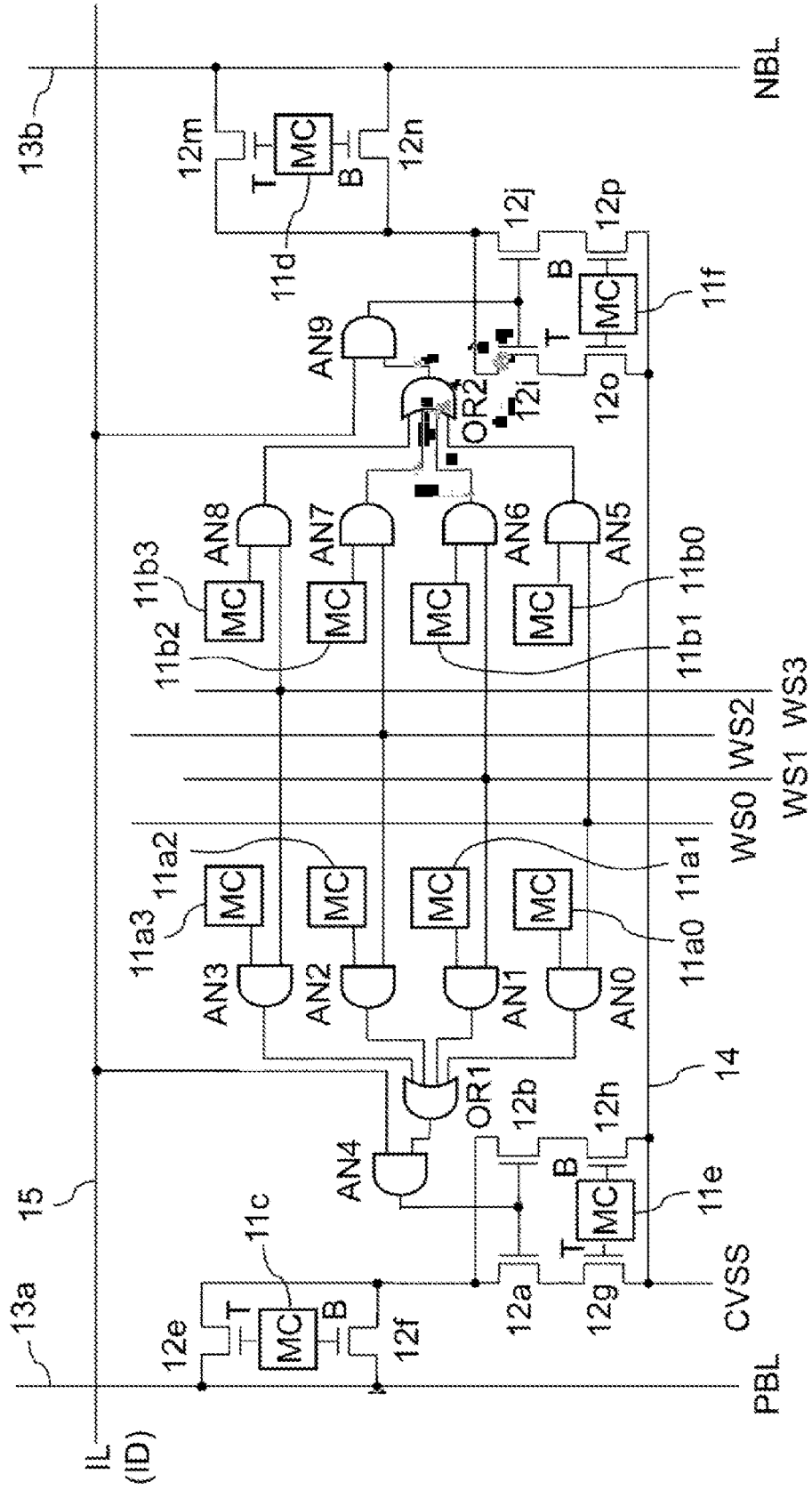
FIG. 17 is a diagram showing a configuration of a product-operation memory cell in a second modification example.

FIG. 17 is a diagram showing a configuration of a product-operation memory cell in a second modification example.

In the embodiment, one weight memory cell 11*a* is arranged on the data line 13*a* side, and one weight memory cell 11*b* is arranged on the data line 13*b* side. Meanwhile, in the second modification example, a plurality of weight memory cells are arranged on each of the data line 13*a* side and the data line 13*b* side.

Four weight memory cells 11*a*0 to 11*a*3 are arranged on the data line 13*a* side, and their respective outputs are supplied to four AND circuits AN0 to AN3. Column selection signal lines WS0 to WS3 are supplied to the AND circuits AN0 to AN3, respectively. The AND circuits AN0 to AN3 perform logical products and their outputs are outputted to an OR circuit OR1. The OR circuit OR1 performs a logical sum, and its output is outputted to the AND circuit AN4. The input data (ID) is supplied to the AND circuit AN4 by the input line 15. The AND circuit AN4 performs a logical product, and its output is supplied to the switches 12*a*, 12*b*.

Four weight memory cells 11*b*0 to 11*b*3 are arranged on the data line 13*b* side, and their respective outputs are supplied to four AND circuits AN5 to AN8. Column selection signal lines WS0 to WS3 are supplied to the AND circuits AN5 to AN8, respectively. The AND circuits AN5 to AN8 perform logical products and their outputs are outputted to the OR circuit OR2. The OR circuit OR2 performs a logical sum, and its output is outputted to the AND circuit AN9. The input data (ID) is supplied to the AND circuit AN9 by the input line 15. The AND circuit AN9 performs a logical product and its output is supplied to the switches 12*l*, 12*j*.

For example, when the memory cells 11*a*0, 11*b*0 are selected by setting the column selection signal line WS0 to a high level, the product operations are performed between the logic values stored in the memory cells 11*a*0, 11*b*0 and the logic value of the input data (ID). Then, the sum operation is performed among the result of the product operations, the current value of the data line 13*a*, and the current value of the data line 13*b*. Incidentally, at this time, the column selection signal lines WS1 to WS3 are kept at low levels so that the memory cells 11*a*1 to 11*a*3 and 11*b*1 to 11*b*3 are not selected.

Since the plurality of weight memory cells are arranged so that columns can be selected, a bit width of the weight memory cell can be adjusted. In this case, an area can be greatly reduced.

Third Modification Example

Figure 18:
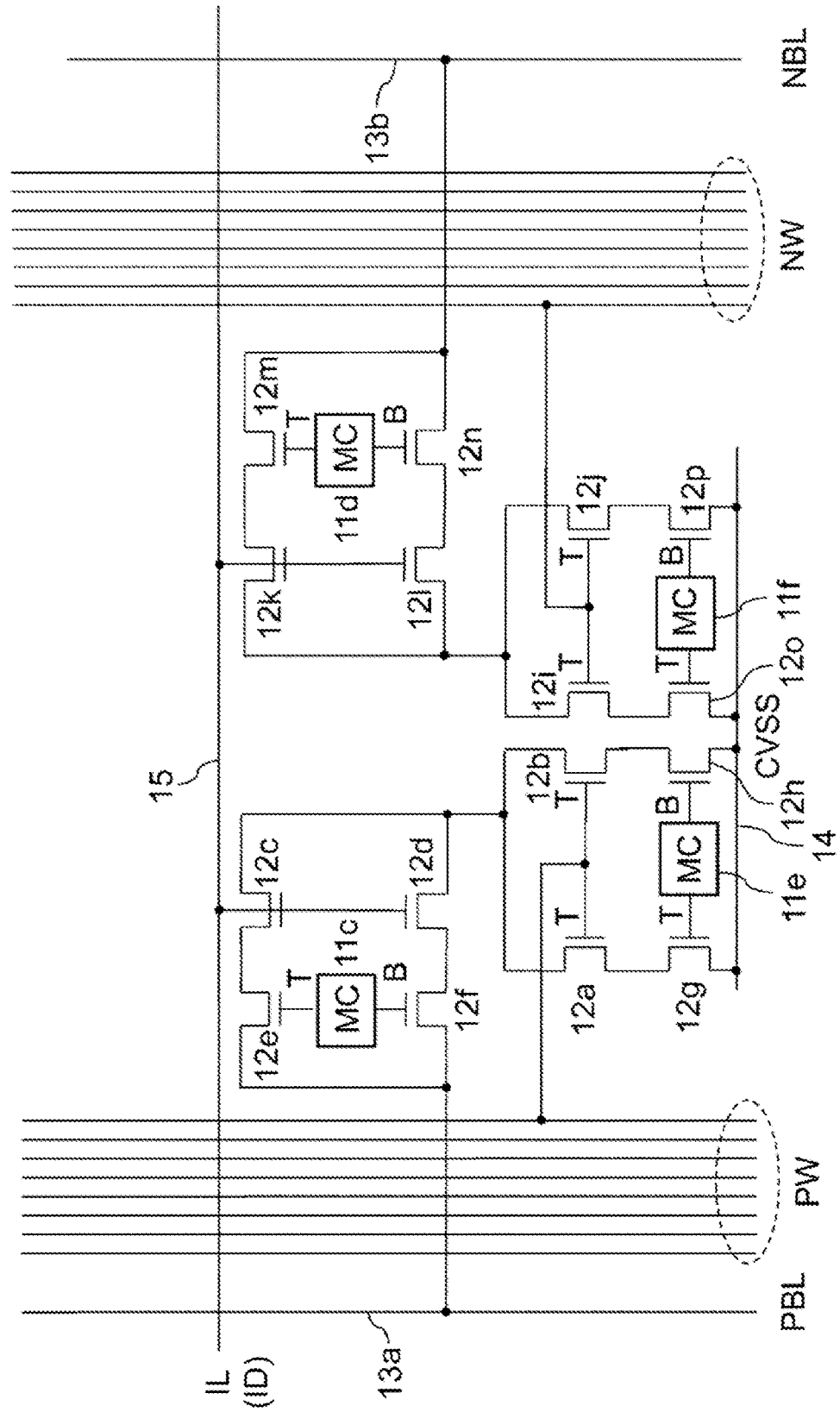
FIG. 18 is a diagram showing a configuration of a product-operation memory cell in a third modification example.

FIG. 18 is a diagram showing a configuration of a product-operation memory cell in a third modification example.

In a product-operation memory cell 10 according to a third modification example, a plurality of weight wirings PW, NW from the SRAM macros arranged outside the memory array 101 are used instead of the weight memory cells 11*a*, 11*b* in the product-operation memory cell 10 according to the embodiment. One of the plurality of weight wirings PW on the data line 13*a* side is connected to the gates of the NMOS transistors forming the switches 12*a*, 12*b*. Then, one of the plurality of weight wirings NW on the data line 13*b* side is connected to the gates of the NMOS transistors forming the switches 12*i*, 12*j*. The number of weight wirings PW, NW is provided correspondingly to the number of product-operation memory cells 10 included in the memory array 101, and the operation is performed by simultaneously inputting weight data to the plurality of product-operation memory cells 10. For example, the number of weight wirings PW and the number of weight wirings NW are thirty-two, respectively.

It is advantageous in terms of area to hold the weight data in the SRAM macro outside the product-operation memory cell and to directly supply it from the SRAM memory rather than to have the weight memory cell inside the product-operation memory cell as in the embodiment.

Fourth Modification Example

Figure 19:
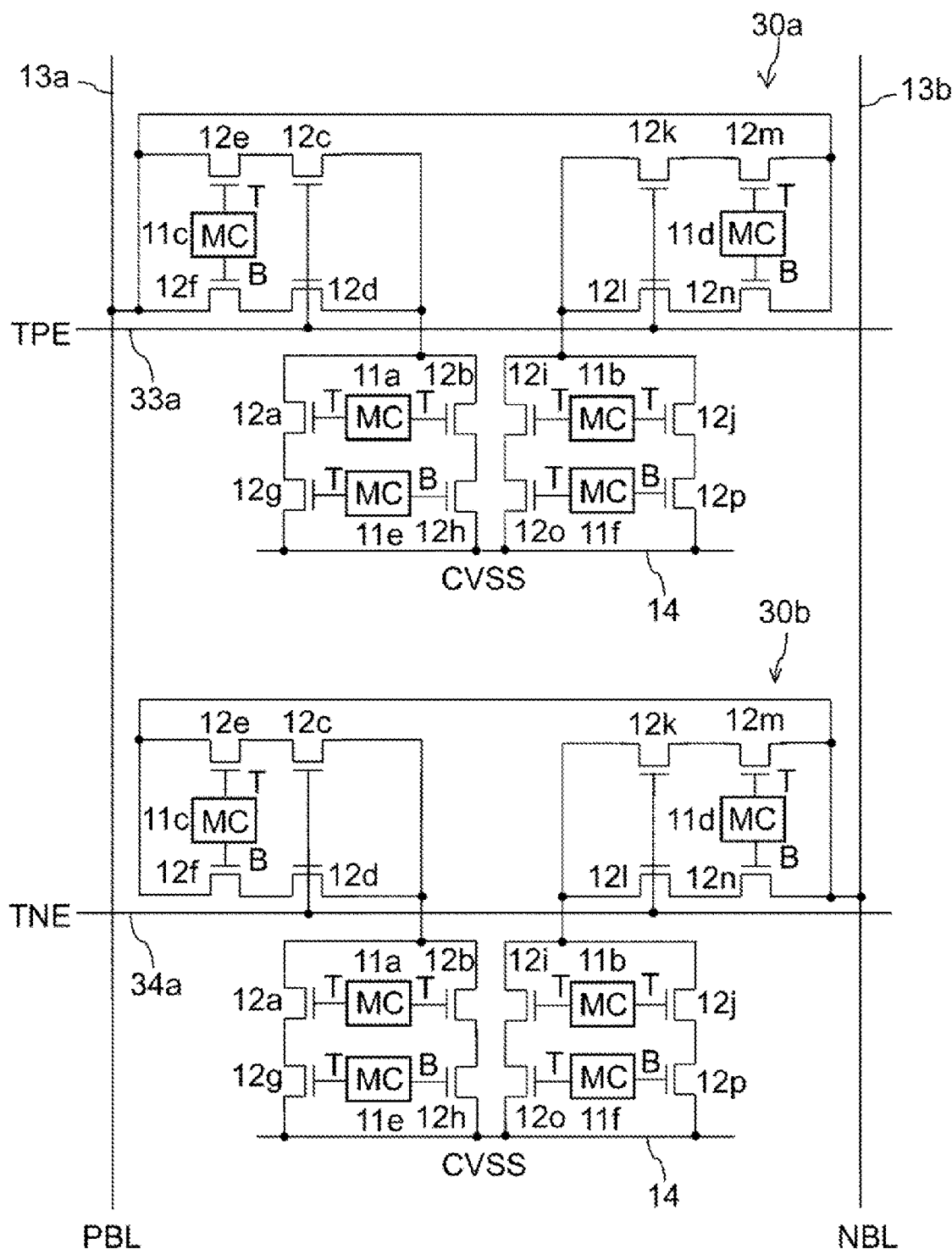
FIG. 19 is a diagram showing a configuration of an adjustment reference cell in a fourth modification example.

FIG. 19 is a diagram showing a configuration of an adjustment reference cell in a fourth modification example.

The adjustment reference cell 30 in the embodiment has selection switches 31*a*, 31*b* on the data line 13*a* side and selection switches 32*a*, 32*b* on the data line 13*b* side in the cell. Therefore, the configuration is not completely the same as that of the product-operation memory cell 10, and a deviation of constant current values occurs.

An adjustment reference cell 30 in a fourth modification example is configured to separately connect two P-side adjustment reference cell 30*a* and N-side adjustment reference cell 30*b*, which have exactly the same configuration as the product-operation memory cell 10, to the data lines 13*a*, 13*b*, respectively. This makes it possible to make a current value of the adjustment reference cell 30 further closer to that of the product-operation memory cell 10, and to perform a more precise product-sum operation than that in the embodiment. The malfunctions during the inference can be prevented. Incidentally, adjustment of the product-operation memory cell 10 is started after the P-side adjustment reference cell 30*a* and the N-side adjustment reference cell 30*b* are adjusted to each other.

Fifth Modification Example

Figure 20:
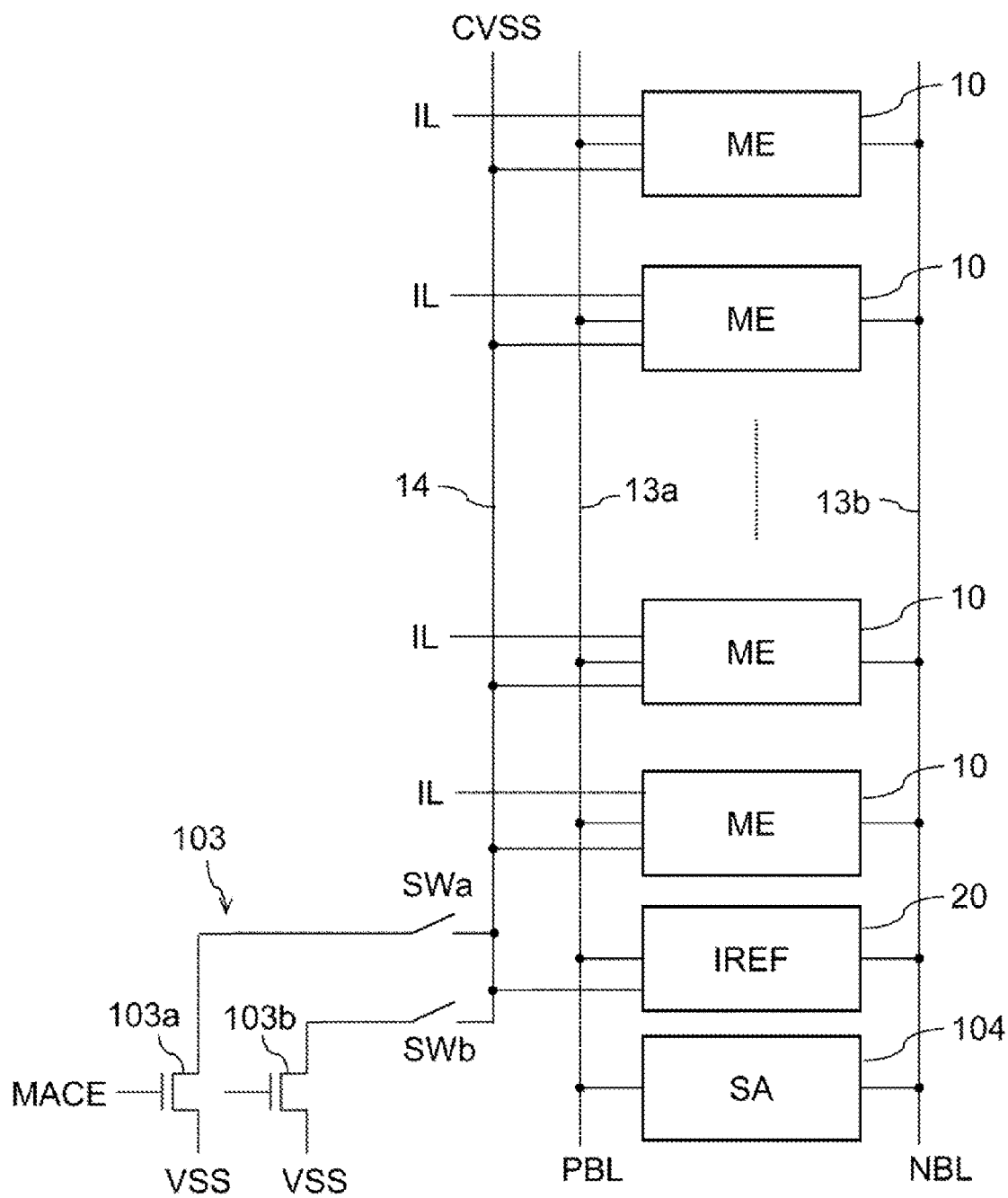
FIG. 20 is a diagram showing a configuration of a memory cell array in a fifth modification example.
Figure 21:
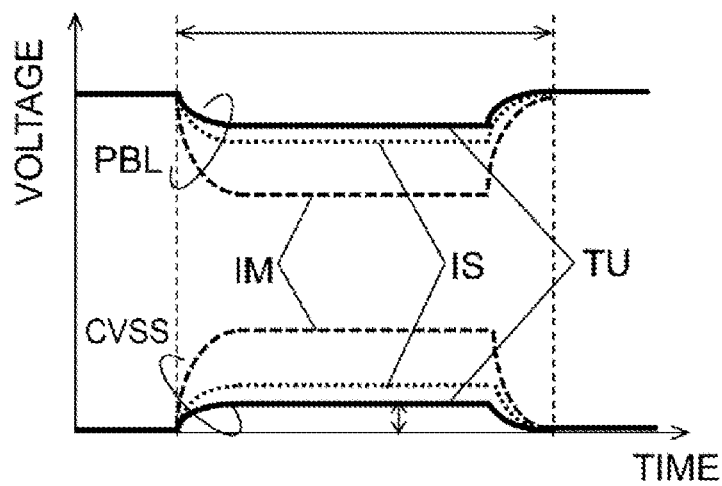
FIG. 21 is a diagram showing voltages on a data line and a common power supply line in the embodiment.
Figure 22:
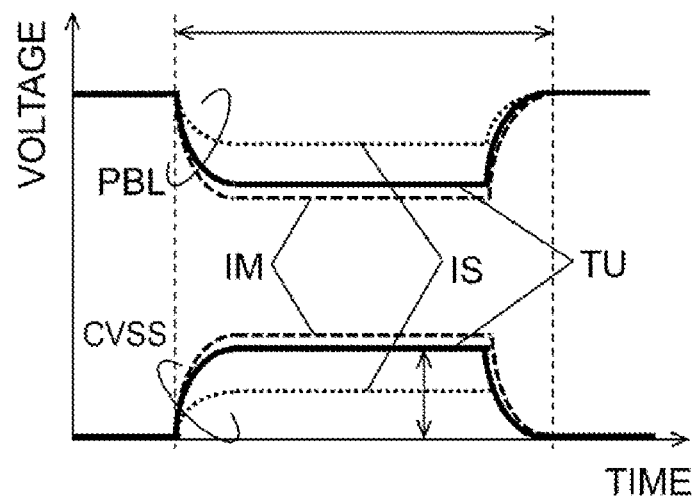
FIG. 22 is a diagram showing voltages in a data line and a common power supply line in a fifth modification example.

FIG. 20 is a diagram showing a configuration of a memory cell array in a fifth modification example. FIG. 21 is a diagram showing voltages on a data line and a common power supply line in the embodiment. FIG. 22 is a diagram showing voltages on a data line and a common power supply line in a fifth modification example. Each horizontal axis of graphs of FIGS. 21 and 22 is time (TIME), and each vertical axis is voltage (VOLTAGE).

The common power supply switch 103 in the embodiment is composed of one switch. A common power supply switch 103 in a fifth modification example is composed of a plurality of switches 103*a*, 103*b* connected in parallel. The plurality of switches 103*a* and 103*b* are composed of NMOS transistors with different driving powers. The switches 103*a*, 103*b* are connected to the common power supply line 14 via switches SWa, SWb.

At the time of adjustment, only one of the cells such as the product-operation memory cell and the inference reference cell is always conducted, and the data line 13*a* or data line 13*b* is discharged. Since the number of conducting cells differs for each operation during actual inference, a potential of the common power supply line (CVSS) differs.

As shown in FIG. 21, a difference between the potential of the common power supply line (CVSS) in a case where the number of conducting cells during the inference (IS) is few and the potential of the common power supply line (CVSS) during the adjustment (TU) is small. A difference between the potential of the common power supply line (CVSS) in a case where the number of conducting cells during the inference (IM) is large and the potential of the common power supply line (CVSS) during the adjustment (TU) is large. Therefore, even if the currents are aligned during the adjustment, the current values may deviate depending on how a body bias is applied during the inference.

For example, during the inference, the switch SWa is set to the ON-state, the switch SWb is set to the OFF-state, and the switch 103*a* is used. During the adjustment, the switch SWa is set to the OFF-state, the switch SWb is set to the ON-state, and the switch 103*b* is used. A gate width of the NMOS transistor forming the switch 103*b* is set smaller than a gate width of the NMOS transistor forming the switch 103*a*.

When the number of conducting cells is large, accuracy tends to drop. Therefore, as shown in FIG. 22, the switch 103*b* is used so as to reduce a difference the potential of the common power supply line (CVSS) in a case where the number of conducting cells during the inference (IM) is large and the potential of the common power supply line (CVSS) during the adjustment (TU). Incidentally, the difference between the potential of the common power supply line (CVSS) in the case where the number conducting cells during the inference (IS) is few and the potential of the common power supply line (CVSS) during the adjustment (TU) is large, but an influence on the accuracy in the case where the number of conducting cells is few is small.

A common power supply switch of different size is used during the adjustment, and a situation during the inference in the case where the number of conducting cells is large is reproduced. Consequently, the malfunctions during the inference can be prevented.

Sixth Modification Example

Figure 23:
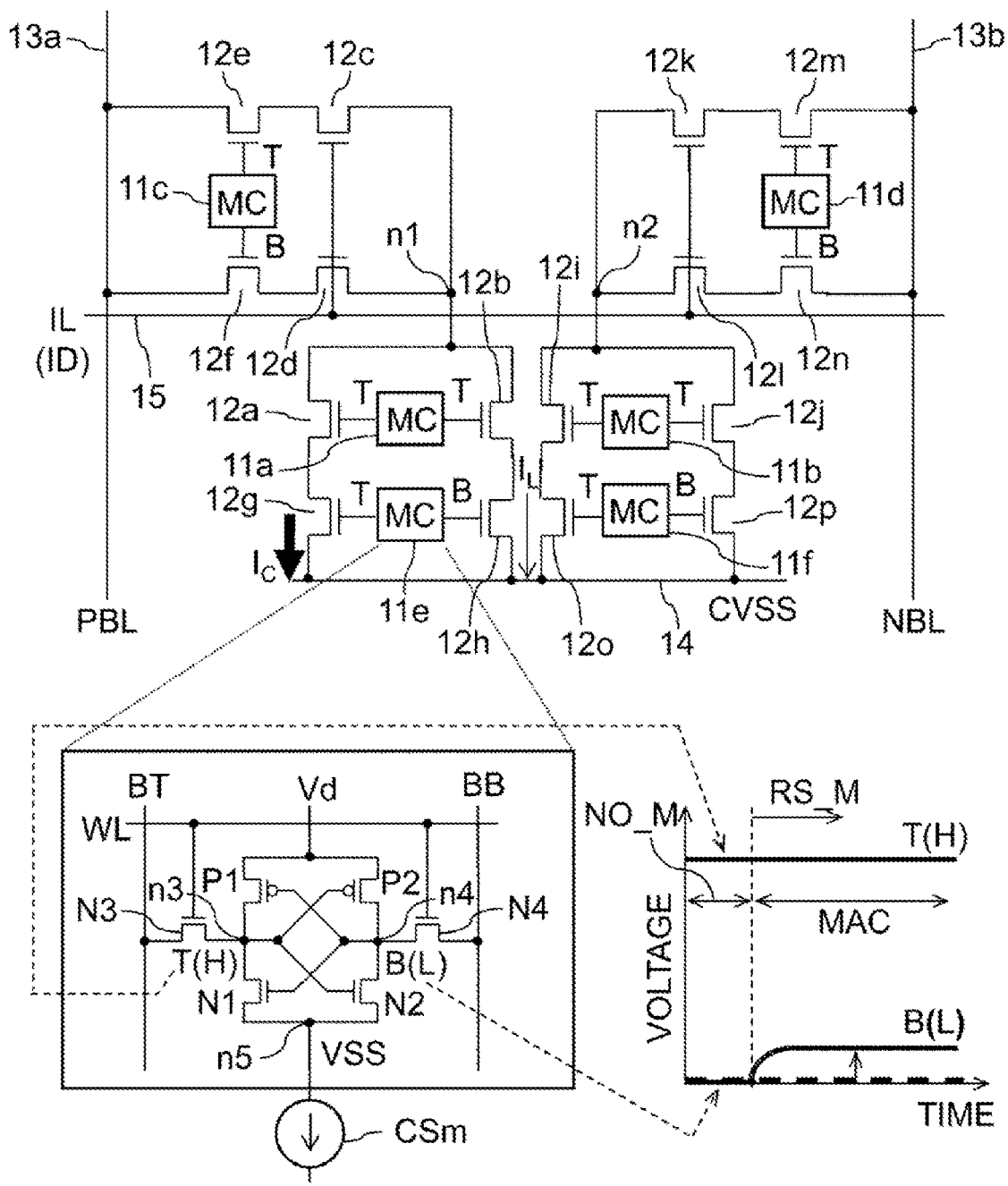
FIG. 23 is a diagram showing a configuration of a product-operation memory cell in a sixth modification.

FIG. 23 is a diagram showing a configuration of a product-operation memory cell in a sixth modification example. A horizontal axis of a graph in FIG. 23 is time (TIME), and a vertical axis is voltage (VOLTAGE).

The SRAM memory has a normal operation mode (NOM) and a resume standby (Resume Standby: RS) mode (RSM) as operation modes. The normal operation mode is an operation mode for executing data reading and data writing. The RS mode is an operation mode for reducing power consumption in a state of retaining data by narrowing the power supply voltage to such an extent that the data is not lost. The power supply voltage is narrowed by setting a potential of a ground wiring of the memory array to a potential higher than a ground potential (0 V) (potential between the power supply potential and the ground potential).

In the embodiment, a ground potential (Vs) is supplied to sources of the NMOS transistors N1, N2 of the SRAM memories forming the memory cells 11a to 11f, and an inference operation is performed in the normal mode. In this modification example, the inference operation (MAC) is performed in the RS mode.

A current source CSm is connected to a node n5 to which the sources of the NMOS transistors N1, N2 of the SRAM memory forming the memory cells 11a to 11f in this modification example are connected. In the RS mode, a driving power of the current source CSm is lowered to make the potential of the node n5 higher than the ground potential (Vs) and to change a source bias. This makes it possible to reduce a sub-threshold leakage current of the off-state MOS transistors forming the memory cells 11a to 11f.

Out of gates of the NMOS transistors connected to the nodes n3, n4 holding the complementary data (T, B) of the memory cells 11a to 11f, a high-level (H) side is not affected, and a low-level (L) side does not affect the inference by remaining shielded, so that the leakage power can be reduced. This will be explained below.

For example, in the memory cell 11e, the node n3 holding complementary data (T) is on the high-level side, and the node n4 holding complementary data (B) is on the low-level side. The node n3 maintains a high-level (H) potential even when changing from the normal operation mode to the RS mode, and the potential of the gate of the NMOS transistor forming the switch 12g is maintained, so that the cell current (IC) is not affected. When the node n4 enters the RS mode, a low-level (L) potential rises, but since the NMOS transistor forming the switch 12h is kept shielded, there is no inference effect due to the leakage current (IL).

As described above, the disclosures made by the disclosers of the present application have been specifically described based on the embodiments, but the present disclosures are not limited to the above-mentioned embodiments and, needless to say, can be variously modified within a range not departing from the scope thereof.

What is claimed is:

1. A semiconductor device comprising:
a first data line;
a second data line;
a memory cell connected to the first data line and the second data line; and
a determination circuit connected to the first data line and the second data line,
wherein the memory cell includes:
a plurality of switches connected to the first data line and the second data line;
a first data holding circuit;
a second data holding circuit;
a third data holding circuit;
a fourth data holding circuit;
an input line and
a current path selection circuit configured to adjust a current path within the memory cell based on values stored in the third data holding circuit and the fourth data holding circuit to reduce variations in characteristic values among multiple memory cells,
wherein the memory cell is configured to perform a product-sum operation by:
activating a switch among the plurality of switches that connects the memory cell to the first data line based on a value stored in the first data holding circuit and input data supplied to the input line; and
activating a switch among the plurality of switches that connects the memory cell to the second data line based on a value stored in the second data holding circuit and the input data supplied to the input line, and
wherein the current path selection circuit adjusts the activation of the switches based on values stored in the third data holding circuit and the fourth data holding circuit, thereby modifying current flow through the memory cell to align characteristic values across multiple memory cells within a memory array.

2. The semiconductor device according to claim 1,
wherein a plurality of memory cells, which are composed of the memory cell, are connected to the first data line and the second data line,
wherein input data is supplied in parallel to the input line of each of the plurality of memory cells,
wherein in the plurality of memory cells, a result of the product operation is outputted to the first data line and the second data line, the result being obtained from the input data and data stored in the first data holding circuit and the second data holding circuit, and
wherein a sum operation of data outputted from the plurality of memory cells is performed.

3. The semiconductor device according to claim 2,
wherein a reference cell is connected to the first data line and the second data line and supplies a reference value of the characteristic value,
wherein a current path is selected based on the values stored in the third data holding circuit and the fourth data holding circuit to align the characteristic value with respect to the reference value.

4. The semiconductor device according to claim 3, further comprising a plurality of current sources commonly connected to the plurality of memory cells,
wherein any of the plurality of current sources are selectable based on a current value in adjusting the current path.

5. The semiconductor device according to claim 2,
wherein each of the first data holding circuit, the second data holding circuit, the third data holding circuit, and the fourth data holding circuit is composed of a SRAM,
wherein the SRAM is operable in a first operating state and in a second operating state that consumes less power than the first operating state, and
wherein a product-sum operation is performed in the second operating state.

6. The semiconductor device according to claim 1,
wherein each of the first data holding circuit and the second data holding circuit is configured by a SRAM formed in a first layout, and
wherein each of the third data holding circuit and the fourth data holding circuit is configured by a SRAM formed in a second layout.

* * * * *